US012610495B2

(12) United States Patent
Yow et al.

(10) Patent No.: US 12,610,495 B2
(45) Date of Patent: Apr. 21, 2026

(54) CHASSIS HAVING TRAYS TO MOUNT DIFFERENT FORM FACTOR ELECTRONIC MODULES TO AN ELECTRONIC DEVICE

(71) Applicant: HEWLETT PACKARD ENTERPRISE DEVELOPMENT LP, Spring, TX (US)

(72) Inventors: See Yun Yow, Singapore (SG); Mun Hoong Tai, Singapore (SG); Kai Siang Loh, Singapore (SG)

(73) Assignee: Hewlett Packard Enterprise Development LP, Spring, TX (US)

( * ) Notice: Subject to any disclaimer, the term of this patent is extended or adjusted under 35 U.S.C. 154(b) by 304 days.

(21) Appl. No.: 18/299,976

(22) Filed: Apr. 13, 2023

(65) Prior Publication Data

US 2024/0349440 A1 Oct. 17, 2024

(51) Int. Cl.
*H05K 7/14* (2006.01)
*H05K 7/18* (2006.01)

(52) U.S. Cl.
CPC ......... *H05K 7/1489* (2013.01); *H05K 7/1487* (2013.01); *H05K 7/18* (2013.01)

(58) Field of Classification Search
CPC .. H05K 7/1487; H05K 7/1488; H05K 7/1489; H05K 7/1418; H05K 7/1421; H05K 7/1425; H05K 7/1435; H05K 7/18; H05K 7/186; G06F 1/181; G06F 1/183; G06F 1/184; G06F 1/185; G06F 1/186; G06F 1/187; G06F 1/16; G06F 1/1658; G11B 33/126; G11B 33/128; G11B 33/022; G11B 33/08; G11B 33/12

USPC ......... 361/679.31, 679.02, 724, 679.37, 727, 361/679.33, 679.32, 728, 729, 730, 725
See application file for complete search history.

(56) References Cited

U.S. PATENT DOCUMENTS

| | | | | | |
|---|---|---|---|---|---|
| 5,454,478 | A | * | 10/1995 | Everson | B65D 25/107 |
| | | | | | 220/528 |
| 5,838,538 | A | * | 11/1998 | Yee | G06F 1/184 |
| | | | | | 361/756 |
| 6,078,504 | A | * | 6/2000 | Miles | G06F 1/184 |
| | | | | | 361/752 |

(Continued)

FOREIGN PATENT DOCUMENTS

CH 613579 A5 9/1979

*Primary Examiner* — Gage Crum
(74) *Attorney, Agent, or Firm* — Hewlett Packard Enterprise Patent Department

(57) ABSTRACT

A chassis for an electronic device includes a tray and a frame. The tray is removably coupled to the frame and includes engagement members to engage with complementary engagement members of electronic modules mounted to the tray. The engagement members include pairs of engagement members disposed adjacent to each other on the tray. The engagement members in each of a first pair and a second pair are spaced apart from each other by a first distance. The first pair and the second pair of engagement members are spaced apart from each other by a second distance different from the first distance. The engagement members are configured to allow for mounting of a first electronic module having a first width to the tray and to allow for mounting of a second electronic module having a second width to the tray, where the second width is different from the first width.

19 Claims, 13 Drawing Sheets

(56) References Cited

U.S. PATENT DOCUMENTS

| | | | | | |
|---|---|---|---|---|---|
| 6,141,211 | A * | 10/2000 | Strickler | | G06F 1/20 |
| | | | | | 361/679.49 |
| 7,099,160 | B1 * | 8/2006 | Ice | | G06F 1/185 |
| | | | | | 361/756 |
| 7,190,574 | B2 * | 3/2007 | Muenzer | | G06F 1/184 |
| | | | | | 361/679.33 |
| 7,414,852 | B1 | 8/2008 | Otte | | |
| 8,670,241 | B2 | 3/2014 | Sherrod et al. | | |
| 9,167,716 | B2 | 10/2015 | Ma et al. | | |
| 9,297,496 | B2 * | 3/2016 | Lee | | F16M 13/02 |
| 9,867,306 | B2 * | 1/2018 | Cheng | | H05K 7/1418 |
| 10,042,396 | B1 | 8/2018 | Gupta et al. | | |
| 10,064,305 | B1 * | 8/2018 | Zhai | | H05K 7/1461 |
| 10,264,701 | B1 * | 4/2019 | Norton | | H05K 7/1424 |
| 10,321,600 | B2 | 6/2019 | Chang et al. | | |
| 10,470,335 | B2 * | 11/2019 | Gupta | | G06F 1/187 |
| 10,863,647 | B1 * | 12/2020 | Escamilla | | H05K 5/023 |
| 11,849,558 | B2 * | 12/2023 | Li | | H05K 7/1407 |
| 2002/0008965 | A1 * | 1/2002 | Amari | | B60R 11/0211 |
| | | | | | 361/730 |
| 2002/0070044 | A1 * | 6/2002 | Pommerenke | | H05K 9/0062 |
| | | | | | 174/382 |
| 2004/0032715 | A1 * | 2/2004 | Ice | | H05K 7/1404 |
| | | | | | 361/679.01 |
| 2007/0119792 | A1 * | 5/2007 | Hendrix | | H05K 7/1425 |
| | | | | | 211/26 |
| 2009/0284907 | A1 * | 11/2009 | Regimbal | | G06F 1/181 |
| | | | | | 361/679.02 |
| 2012/0242203 | A1 * | 9/2012 | Gong | | G06F 1/187 |
| | | | | | 312/223.2 |
| 2012/0286634 | A1 * | 11/2012 | Tanaka | | H05K 7/1425 |
| | | | | | 312/223.2 |
| 2013/0009529 | A1 * | 1/2013 | Zhu | | G06F 1/187 |
| | | | | | 312/223.2 |
| 2014/0049897 | A1 * | 2/2014 | Hoss | | G06F 1/187 |
| | | | | | 361/679.31 |
| 2014/0240915 | A1 | 8/2014 | Phelan et al. | | |
| 2015/0055294 | A1 * | 2/2015 | Sato | | H05K 7/1421 |
| | | | | | 361/679.01 |
| 2016/0291645 | A1 * | 10/2016 | Alvaradp | | G06F 1/183 |
| 2017/0079156 | A1 * | 3/2017 | Hsiao | | H05K 7/1488 |
| 2017/0339799 | A1 * | 11/2017 | Su | | H05K 7/1489 |
| 2020/0275578 | A1 * | 8/2020 | Murakami | | H05K 7/1487 |
| 2022/0350935 | A1 * | 11/2022 | Strickland | | G06F 30/17 |

* cited by examiner

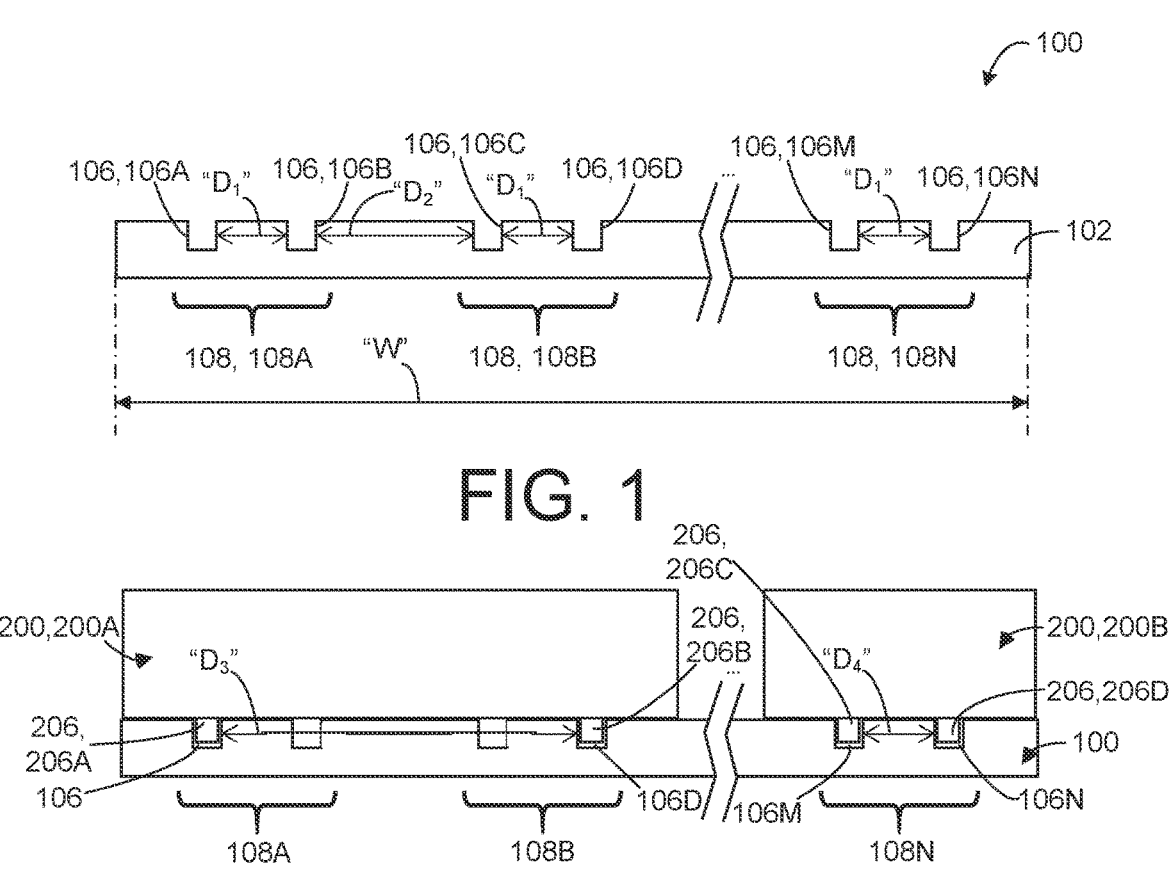
FIG. 1
FIG. 2A
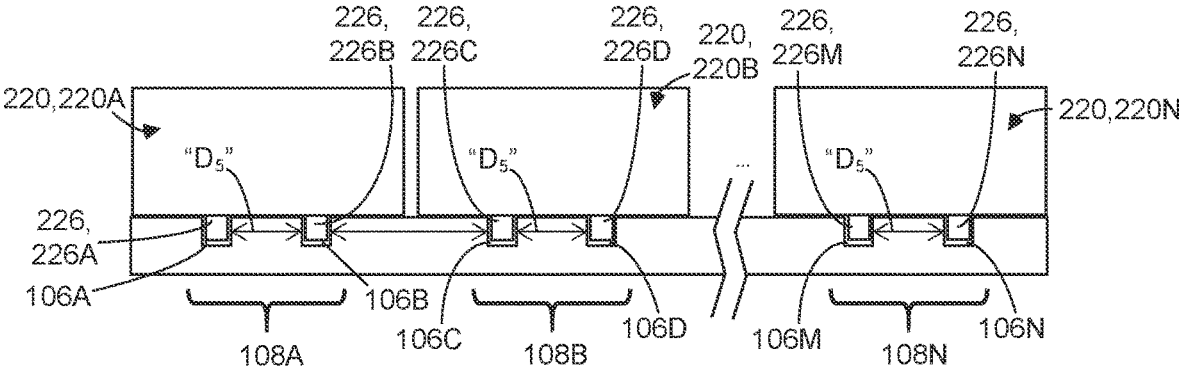
FIG. 2B

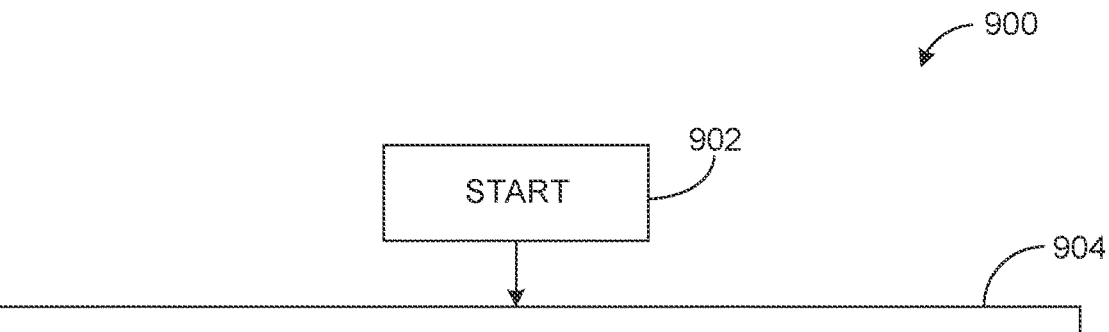

900

902

START

904

ENGAGE SOME OF A PLURALITY OF FIRST ENGAGEMENT MEMBERS OF A FIRST TRAY AMONG A PLURALITY OF TRAYS OF A CHASSIS WITH FIRST COMPLEMENTARY ENGAGEMENT MEMBERS OF A FIRST ELECTRONIC MODULE HAVING A FIRST WIDTH, AS THE FIRST ELECTRONIC MODULE IS MOUNTED TO THE FIRST TRAY

ENGAGE A FIRST PAIR OF ENGAGEMENT MEMBERS OR A SECOND PAIR OF ENGAGEMENT MEMBERS OF A PLURALITY OF SECOND ENGAGEMENT MEMBERS OF A SECOND TRAY AMONG THE PLURALITY OF TRAYS WITH SECOND COMPLEMENTARY ENGAGEMENT MEMBERS OF A SECOND ELECTRONIC MODULE HAVING A SECOND WIDTH, AS THE SECOND ELECTRONIC MODULE IS MOUNTED TO THE SECOND TRAY, WHERE THE FIRST WIDTH IS DIFFERENT FROM THE SECOND WIDTH, WHERE THE FIRST TRAY AND THE SECOND TRAY ARE VERTICALLY SPACED APART FROM EACH OTHER BY A HEIGHT, WHICH IS ONE OF A 1 UNIT (1U) HEIGHT OR A 2U HEIGHT, WHERE EACH OF THE FIRST ENGAGEMENT MEMBERS AND THE SECOND ENGAGEMENT MEMBERS INCLUDES THE FIRST PAIR OF ENGAGEMENT MEMBERS AND THE SECOND PAIR OF ENGAGEMENT MEMBERS, WHERE ENGAGEMENT MEMBERS IN EACH PAIR OF THE FIRST PAIR OF ENGAGEMENT MEMBERS AND THE SECOND PAIR OF ENGAGEMENT MEMBERS ARE SPACED APART FROM EACH OTHER BY A FIRST DISTANCE, AND WHERE THE FIRST PAIR OF ENGAGEMENT MEMBERS AND THE SECOND PAIR OF ENGAGEMENT MEMBERS ARE SPACED APART FROM EACH OTHER BY A SECOND DISTANCE DIFFERENT FROM THE FIRST DISTANCE

906

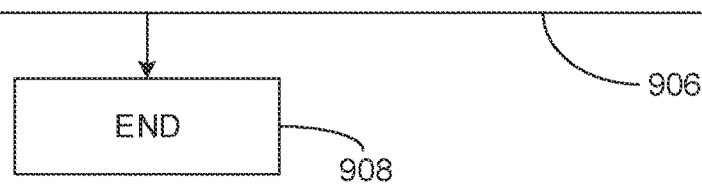

END

CHASSIS HAVING TRAYS TO MOUNT DIFFERENT FORM FACTOR ELECTRONIC MODULES TO AN ELECTRONIC DEVICE

BACKGROUND

An electronic device such as a networking device, a storage device, a computing device, or the like may include one or more electronic modules such as, line cards, solid state drives ("SSDs"), servers, or the like. A chassis of such electronic device may have one or more trays for receiving those electronic modules. Accordingly, the electronic modules may be directly mounted to the trays and connected to a backplane circuit board or midplane circuit board of the electronic device. Thus, the chassis may facilitate installation and uninstallation (e.g., hot-swapping) of the electronic modules to the electronic device. In this manner, the chassis may be used to configure the electronic modules, as a field replaceable unit (FRU) of the electronic device.

BRIEF DESCRIPTION OF THE DRAWINGS

Various examples will be described below with reference to the following figures.

FIG. 1 illustrates a block diagram of a tray of a chassis according to an example of the present disclosure.

FIG. 2A illustrates a block diagram of the tray of FIG. 1, a first electronic module having a first form factor, and a second electronic module having a second form factor according to an example of the present disclosure.

FIG. 2B illustrates a block diagram of the tray of FIG. 1 and a plurality of electronic modules having a second form factor according to an example of the present disclosure.

FIG. 9 is a flowchart depicting a method of assembling one or more electronic modules having different form factors to an electronic device according to one example of the present disclosure.

DETAILED DESCRIPTION

Figure 2C:
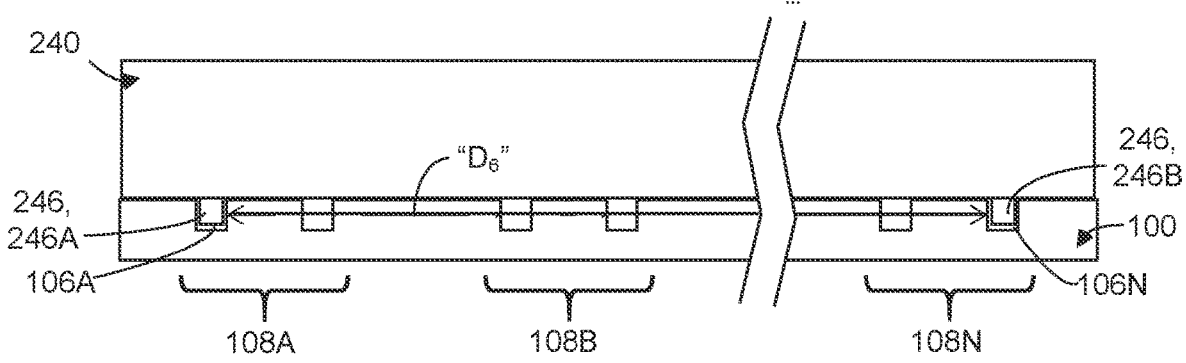
FIG. 2C illustrates a block diagram of the tray of FIG. 1 and an electronic module having a third form factor according to an example of the present disclosure.

The following detailed description refers to the accompanying drawings. For purposes of explanation, certain examples are described with reference to the components illustrated in FIGS. 1-9. The functionality of the illustrated components may overlap, however, and may be present in a fewer or greater number of elements and components. Moreover, the disclosed examples may be implemented in various environments and are not limited to the illustrated examples. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

Generally, a chassis has trays that are rigidly coupled to side walls of the chassis in a predetermined arrangement so as to receive electronic modules having specific form factors. Each tray is usually configured to receive one specific form factor of electronic module, and will not allow other form factors to be mounted thereto. For example, one tray may be configured to receive an electronic module having a first height and a first width, another tray may be configured to receive an electronic module having the first height and a second width, another tray may be configured to receive an electronic module having a second height and the first width, yet another tray may be configured to receive an electronic module having the second height and the second width, and so on. The form factor that a tray can receive may be controlled by keying features on the tray and/or by the dimensional constraints of the slots or receptacles defined by the chassis. Generally once the trays are coupled to the chassis, the configuration of electronic modules that can be used in the chassis is essentially fixed. Thus, users may be limited in the types of electronic modules that may be installed in a given chassis. This reduces the flexibility of the system and may also inhibit future upgrades or changes to the system. For example, if a user desires to modify an existing system by upgrading from one electronic module to another newer electronic module with a different form factor, the user may not be able to make this upgrade without obtaining an entirely new chassis (or making extensive modifications to the existing chassis) because the newer electronic module may not be compatible with the trays of the existing chassis. In addition, manufacturers that would like to provide systems having multiple different configuration options for the electronic modules may have to design and manufacture multiple different chassis to accommodate these different configurations, which imposes additional costs and may require having multiple SKUs for the various chassis.

A technical solution to the aforementioned problems includes implementing trays in a chassis of the electronic device that are configured to receive one or more electronic modules of varying form factors (e.g., varying widths). For example, the same tray may be configured to be capable of receiving either a full-width electronic module or two half-width electronic modules. Moreover, the trays may be configured to also prevent installation of electronic modules in incorrect positions. For example, returning to the tray that can receive one full-width electronic module or two half-width electronic modules, the tray may be configured to prevent installation of the half-width electronic module at an inappropriate position (e.g., at an intermediate position between two allowed left and right installation positions).

This ability of a given tray to receive different form factors of electronics modules while preventing installation at incorrect positions may be provided by engagement members arranged on the tray. In particular, each tray may include a plurality of engagement members arranged to engage with complementary engagement members of the one or more electronic modules as the one or more electronic modules are mounted to the tray. The engagement members of the trays are arranged in a predetermined pattern that defines allowed installation positions for various electronic modules of a plurality of different form factors, such that when one of the electronic modules is positioned at one of the allowed installation positions, each of the complementary engagement features of the electronic module is able to engage with a corresponding engagement feature of the tray. Conversely, if the electronic module is at a disallowed position (or if the electronic module has a form factor that is not compatible with the tray), then at least one of the complementary engagement features of the electronic module will be not aligned with any of the engagement features of the tray, and thus installation of the electronic module is prevented. Thus, the engagement members allow for multiple different form factors of electronic modules to be used with the tray while also preventing installation at disallowed positions.

In some examples, the plurality of engagement members are arranged into multiple pairs (e.g., two pairs, three pairs, four pairs, or any number of pairs), with each pair including two adjacent engagement members. For each pair, the engagement members of the pair are spaced apart from one another by an intra-pair spacing. Various form factors of electronic modules are provided with complementary engagement members arranged so as to engage with one or more of the pairs of engagement members of the tray when in an allowed installation position.

Some form factors of electronic modules may engage with just one pair of engagement members, while other form factors of electronic modules may engage with multiple of the pairs of engagement members. For example, a smaller form factor electronic module (e.g., a half-width electronic module) may engage with just one pair of engagement members, while a large form factor electronic module (e.g., a full-width electronic module) may span across and engage with multiple pairs of engagement members. Thus, the pairs of engagement members allow for various combinations of electronic modules to be installed at various allowed installation positions on the tray.

In some implementations, each pair of engagement members may have the same intra-pair spacing as the others, which corresponds to a spacing between the complementary engagement members of a form factor of electronic module. Thus, in these implementations each pair of engagement members defines an allowed installation position for electronic modules of the first form factor, and electronic modules of the first form factor can be installed on the tray at any of these allowed installation positions by engaging with the corresponding pairs of engagement members. In other implementations, the intra-pair spacing can differ between two pairs of engagement members, which in some examples may allow one form factor to be installed at one pair and another form factor to be installed at another pair, but not vice versa.

In addition, the pairs are separated from one another by an inter-pair spacing, and this inter-pair spacing is different than any of the intra-pair spacings. Because the inter-pair spacing is different than any of the intra-pair spacings, it may not be possible to install an electronic module that is configured to engage with one of the pairs of engagement members at a position that is intermediate between two of the pairs. This is because the spacing of the complementary engagement members of the electronic module will be different from the inter-pair spacing, and therefore at least one complementary engagement member will not be aligned with any engagement member. This prevents inadvertent installation of an electronic module in a disallowed position, which can be beneficial in some circumstances because the electronic module may be non-functional in the disallowed position (e.g., because the backplane/midplane may not have electrical connectors positioned to mate with the electronic module in the disallowed position). Moreover, in some cases, attempting to install the electronic module in the disallowed position could even damage the electronic module or backplane/midplane of the electronic device. In contrast, if the intra-pair spacing were the same as an inter-pair spacing, then an electronic module could be installed at an intermediate position between pairs by engaging with one engagement feature from each pair.

For example, in one or more examples, the plurality of engagement members may include a first pair of engagement members and a second pair of engagement members. In such examples, the engagement members in the first pair of engagement members are spaced apart from each other by a first distance, and similarly the engagement members in the second pair of engagement members are also spaced apart from each other by the first distance. The first distance matches the spacing between the complementary engagement members of a first form factor of electronic module, and the first and second pairs of engagement members define two allowed installation positions for the first form factor of electronic module: one position associated with the first pair (e.g., a left side installation position) and the other being associated with the second pair (e.g., a right side installation position). For example, in some implementations the first form factor includes half-width electronic modules, which have a width approximately equal to half the width of the tray. In addition, in some examples a second form factor of electronic module, which differs from the first form factor, spans across and engages with both of the first and second pairs of engagement members (e.g., at least one complementary engagement member of the electronic module engages with the first pair and at least one other complementary engagement member engages with the second pair). In some examples, the second form factor includes full-width electronic modules that extend across substantially the full-width of the tray. Thus, the first and second pairs of engagement members can allow for various combinations of electronic modules to be installed on the tray, such as having two electronic modules of the first form factor installed side-by-side on the tray or having one electronic module of the second form factor installed on the tray (or other combinations of other form factors). Further, the first pair of engagement members and the second pair of engagement members are spaced apart from each other by a second distance different from the first distance. Thus, it is not possible to install an electronic module of the first form factor or of the second form factor at a disallowed position between the two allowed positions described above.

More specifically, in one or more implementations, at least some of the plurality of engagement members of the tray may engage with complementary engagement members of a first electronic module (e.g., of the second form factor) in a state of the first electronic module being mounted to the tray. Alternately, the first pair of engagement members of the same tray may engage with complementary engagement members of a second electronic module (e.g., of the first form factor) in a state of the second electronic module being mounted to the tray in a first position, and the second pair of engagement members of the same tray may engage with complementary engagement members of a third electronic module (e.g., of the first form factor) in a state of the third electronic module being mounted to the tray in a second position. However, the plurality of engagement members of the same tray may prevent mounting of the second electronic module or the third electronic device to the tray in an intermediate position between the first position and the second position. In other words, the plurality of engagement members may prevent mounting of the second electronic module or the third electronic module to the tray in any position other than the first position and the second position. Hence, in some examples, the plurality of engagement members of the same tray can mount either the first electronic module having a first width (e.g., a full-width line card) on the base of the tray or one of the second electronic module and the third electronic module (e.g., a half-width line card) on the base of the tray. In other words, the tray may be able to mount either one full-width line card or two half-width line cards.

Additionally, the trays may be removably coupled to the chassis at multiple different mounting locations along a height dimension of the chassis so as to allow for the spacing between adjacent trays (in the height dimension) to be varied. For example, a first tray and a second tray may be disposed spaced apart from each other by 1 U height or 2 U height. Thus, the chassis may be configured to receive one or more electronic modules of varying form factors (e.g., height). For example, the chassis may allow the electronic modules having a first height (e.g., a 1 U line card) or the electronic modules having a second height (e.g., a 2 U line card) to be mounted to the tray. In some examples, a mezzanine tray having a half-width may be removably coupled to the chassis. Accordingly, in such examples, the chassis may include one electronic module having 2 U height and half-width, and two electronic modules having 1 U height and half-width each disposed adjacent to each other on the tray.

Since the tray provides the options of accommodating different form factor electronic modules in the chassis, it provides flexibility to upgrade the existing electronic modules of varying form factors without changing the chassis. As the chassis can be reconfigured to support electronic modules of varying form factors, next generation electronic modules may be designed to any of the known form factor to easily fit into existing chassis. Hence, cost incurred from redesigning of a chassis, based on the varying form factors of the electronic modules may be avoided. Further, the chassis designed may extend to the lifecycle of a single chassis, providing substantial cost saving for the next generation of electronic modules. Additionally, the chassis may provide support to an extensive range of electronic modules, from low power/speeds to very high power/speeds, typically seen in 2 U products. Thus, the chassis configured to provide support to electronic modules of different form factors, the chassis may also be able to support a wide range of speeds, ports and power to the electronic device.

Further, each electronic module mounted to the tray may also be latched to the tray to prevent accidental falling off of the electronic module from the chassis. Additionally, the tray may include electro-magnetic gaskets to contact the electronic modules, and thereby discharge electrostatic energy stored in the electronic module to the tray and prevent an electromagnetic interference (EMI) noise from radiating through the electronic module.

FIG. 1 depicts a block diagram of a tray 100 of a chassis of an electronic device (not shown). The tray 100 includes a base 102 having a plurality of engagement members 106 disposed or formed adjacent to each other along a width "W" of the tray 100. In some examples, the plurality of engagement members 106 has multiple pairs of engagement members 108. For example, the multiple pairs of engagement members 108 includes a first pair of engagement members 108A, a second pair of engagement members 108B, and up to a last pair of engagement members 108N. In such examples, engagement members among each of the first pair of engagement members 108A, the second pair of engagement members 108B, and the last pair of engagement members 108N are disposed spaced apart from each other by a first distance "$D_1$". In other words, the engagement members in each of the multiple pairs of engagement members 108 are separated from one another by an intra-pair distance (spacing) "$D_1$". In particular, a first engagement member 108A and a second engagement member 108B in the first pair of engagement members 108A may be separated from each other by the first distance "$D_1$". Similarly, a third engagement member 108C and a fourth engagement member 108D in the second pair of engagement members 108B may be separated from each other by the first distance "$D_1$". Further, a penultimate engagement member 106M and a last engagement member 106N in the last pair of engagement members 108N may be separated from each other by the first distance "$D_1$". However, adjacent pair of engagement members among the multiple pairs of engagement members 108 (e.g., the first pair of engagement members 108A and the second pair of engagement members 108B) are separated from one another by a second distance "$D_2$" or an inter-pair distance. In some examples, the second distance "$D_2$" is greater than the first distance "$D_1$". In the example of FIG.

1, each engagement member of the plurality of engagement members 106 is a recess (e.g., a track, a groove, a slot, a channel, or the like). In some other examples, each engagement member of the plurality of engagement members 106 may be a protrusion (e.g., a flange, a rail, a post, a screw head, or the like). Although three pairs of engagement members 108 are shown, it should be understood that any number of pairs of engagement members 108 equal to or greater than two pairs may be included in the tray 100.

FIG. 2A depicts a block diagram of the tray 100 and a plurality of electronic modules 200. In some examples, the plurality of electronic modules 200 includes a first electronic module 200A and a second electronic module 200B. In some examples, the first electronic module 200A is a full-width electronic module and the second electronic module 200B is a half-width electronic module. In one or more examples, each electronic module among the plurality of electronic modules 200 includes a plurality of complementary engagement members 206. For example, the first electronic module 200A has a first complementary engagement member 206A and a second complementary engagement member 206B. Similarly, the second electronic module 200B has a third complementary engagement member 206C and a fourth complementary engagement member 206D. In such examples, the first complementary engagement member 206A and the second complementary engagement member 206B in the first electronic module 200A are separated from each other by a third distance "$D_3$". The third complementary engagement member 206C and the fourth complementary engagement member 206D in the second electronic module 200B are separated from each other by a fourth distance "$D_4$". In some examples, the third distance "$D_3$" is greater than the fourth distance "$D_4$". However, the fourth distance "$D_4$" is equal to the first distance "$D_1$" (as labeled in FIG. 1) between the engagement members among each pair of the multiple pairs of engagement members 108.

In one or more examples, the first electronic module 200A is disposed on the tray 100 such that the first complementary engagement member 206A is engaged to the first engagement member 106A of the tray 100 and the second complementary engagement member 206A is engaged to the fourth engagement member 106D of the tray. Similarly, the second electronic module 200B is disposed on the tray 100 such that the third complementary engagement member 206C is engaged to the penultimate engagement member 106M of the tray 100 and the fourth complementary engagement member 206D is engaged to the last engagement member 106N of the tray 100. In other words, the half-width electronic module 200B may engage with just one pair of engagement members e.g., 108B, while the full-width electronic module 200A may span across and engage with multiple pairs of engagement members 108A, 108B. Thus, the multiple pairs of engagement members 108 allow for various combinations of electronic modules 200 to be installed at various allowed installation positions on the tray 100.

FIG. 2B depicts a block diagram of the tray 100 and a plurality of electronic modules 220. In some examples, the plurality of electronic modules 220 includes a first electronic module 220A, a second electronic module 220B, and a last electronic module 220N. In some examples, each of the first electronic module 220A, the second electronic module 220B, and the last electronic module 220N is a half-width electronic module. In one or more examples, each electronic module among the plurality of electronic modules 220 includes a plurality of complementary engagement members 226. For example, the first electronic module 220A has a first complementary engagement member 226A and a second complementary engagement member 226B. Similarly, the second electronic module 220B has a third complementary engagement member 226C and a fourth complementary engagement member 226D. The last electronic module 220N has a penultimate complementary engagement member 226M and a last complementary engagement member 226N. In such examples, the complementary engagement members 226 in each of the plurality of electronic modules 220 are separated by a fifth distance "$D_5$". For example, the first complementary engagement member 226A and the second complementary engagement member 226B in the first electronic module 220A are separated from each other by the fifth distance "$D_5$". Similarly, the third complementary engagement member 226C and the fourth complementary engagement member 226D in the second electronic module 220B are separated from each other by the fifth distance "$D_5$". Further, the penultimate complementary engagement member 226N and the last complementary engagement member 226N in the last electronic module 220N are separated from each other by the fifth distance "$D_5$". In some examples, the fifth distance "$D_5$" is equal to the first distance "$D_1$" (as labeled in FIG. 1) between the engagement members among each pair of the multiple pairs of engagement members 108.

In one or more examples, the first electronic module 220A is disposed on the tray 100 such that the first complementary engagement member 226A is engaged to the first engagement member 106A of the tray 100 and the second complementary engagement member 226A is engaged to the second engagement member 106B of the tray 100. Similarly, the second electronic module 220B is disposed on the tray 100 such that the third complementary engagement member 226C is engaged to the third engagement member 106C of the tray 100 and the fourth complementary engagement member 226D is engaged to the fourth engagement member 106D of the tray 100. Further, the last electronic module 220N is disposed on the tray 100 such that the penultimate complementary engagement member 226M is engaged to the penultimate engagement member 106M of the tray 100 and the last complementary engagement member 226N is engaged to the last engagement member 106N of the tray 100. In other words, each of the half-width electronic module 220 may engage with just one pair of engagement members 108 of the tray 100. In some examples, each pair of engagement members 108 may have the same intra-pair spacing or the first distance "$D_1$" as the others, which corresponds to a spacing between the complementary engagement members or the fifth distance "$D_5$" of the second form factor electronic module. Thus, in these implementations each pair of engagement members 106 defines an allowed installation position for electronic modules of the second form factor, and electronic modules 220 of the second form factor can be installed on the tray 100 at any of these allowed installation positions by engaging with the corresponding pairs of engagement members 108.

FIG. 2C depicts a block diagram of the tray 100 and an electronic module 240 (e.g., a third electronic module). In some examples, the electronic module 240 is a multiple full-width electronic module. In one or more examples, the electronic module 240 has a plurality of complementary engagement members 246. For example, the electronic module 240 has a first complementary engagement member 246A and a second complementary engagement member 246B. In such examples, the complementary engagement members 246 in the electronic module 240 are separated by a sixth distance "$D_6$". In some examples, the sixth distance "$D_6$" is greater than the first distance "$D_1$" (as labeled in FIG. 1) between the engagement members among each pair of the multiple pairs of engagement members 108 and the second distance "$D_2$" between the pairs of engagement members among the multiple pairs of engagement members 108. In one or more examples, the electronic module 240 is disposed on the tray 100 such that the first complementary engagement member 246A is engaged to the first engagement member 106A of the tray 100 and the second complementary engagement member 246A is engaged to the last engagement member 106N of the tray 100. Accordingly, the electronic module 240 may span across and engage with at least two engagement members in the multiple pairs of engagement members 108.

Figure 2D:
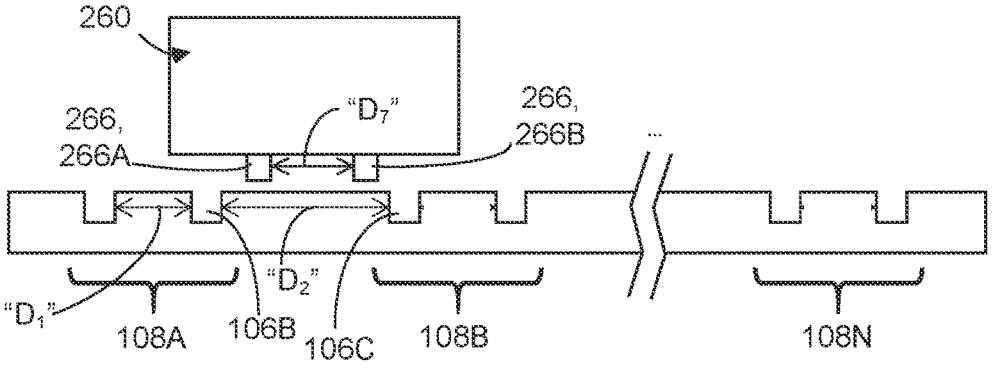
FIG. 2D illustrates a block diagram of the tray of FIG. 1 and an electronic module having a second form factor according to an example of the present disclosure.

FIG. 2D depicts a block diagram of the tray 100 and an electronic module 260 (e.g., a second electronic module). In some examples, the electronic module 260 is a half-width electronic module. In one or more examples, the electronic module 260 has a plurality of complementary engagement members 266. For example, the electronic module 260 has a first complementary engagement member 266A and a second complementary engagement member 266B. In such examples, the complementary engagement members 266 in the electronic module 260 are separated by a seventh distance "$D_7$". In some examples, the seventh distance "$D_7$" is equal to the first distance "$D_1$" (as labeled in FIG. 1) between the engagement members among each pair of the multiple pairs of engagement members 108 or different from the second distance "$D_2$" between the pairs of engagement members among the multiple pairs of engagement members 108. In one or more examples, the electronic module 260 is disposed on the tray 100 at an intermediate position. Accordingly, the engagement member 106 disallows the electronic module 260 to be installed to the tray 100. In particular, because the inter-pair spacing or the second distance "$D_2$" is different than any of the intra-pair spacing or the seventh distance "$D_7$", it may not be possible to install the electronic module 260 that is configured to engage with one of the pairs of engagement members 108 at a position that is intermediate between two of the pairs e.g., 108A and 108B. This is because the spacing or the seventh distance "$D_7$" of the complementary engagement members of the electronic module 260 will be different from the inter-pair spacing or the first distance "$D_1$", and therefore at least one complementary engagement member 266 will not be aligned with any engagement member 106. This prevents inadvertent installation of the electronic module 260 in a disallowed position, which can be beneficial in some circumstances because the electronic module 260 may be non-functional in the disallowed position (e.g., because the backplane/midplane may not have electrical connectors positioned to mate with the electronic module in the disallowed position). Moreover, in some cases, attempting to install the electronic module 260 in the disallowed position could even damage the electronic module 206 or backplane/midplane of the electronic device. In contrast, if the intra-pair spacing of the first distance "$D_1$" were the same as the inter-pair spacing or the second distance "$D_2$", then the electronic module 260 could be installed at an intermediate position between the first pair and second pair of engagement members 108A, 108B by engaging with one engagement member from each of the first pair and second pair of engagement members 108A, 108B.

Figure 3A:
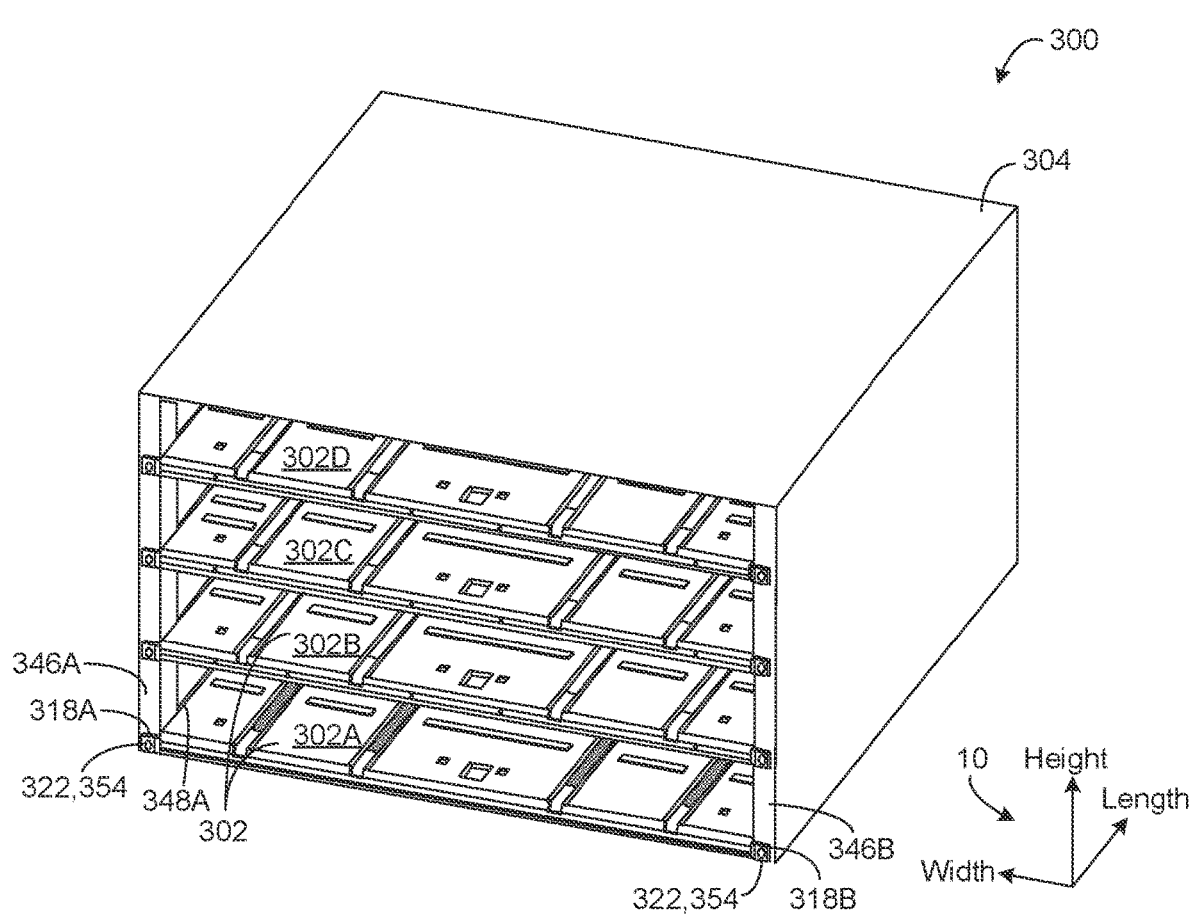
FIG. 3A illustrates a perspective view of a chassis of an electronic device according to an example of the present disclosure.
Figure 3B:
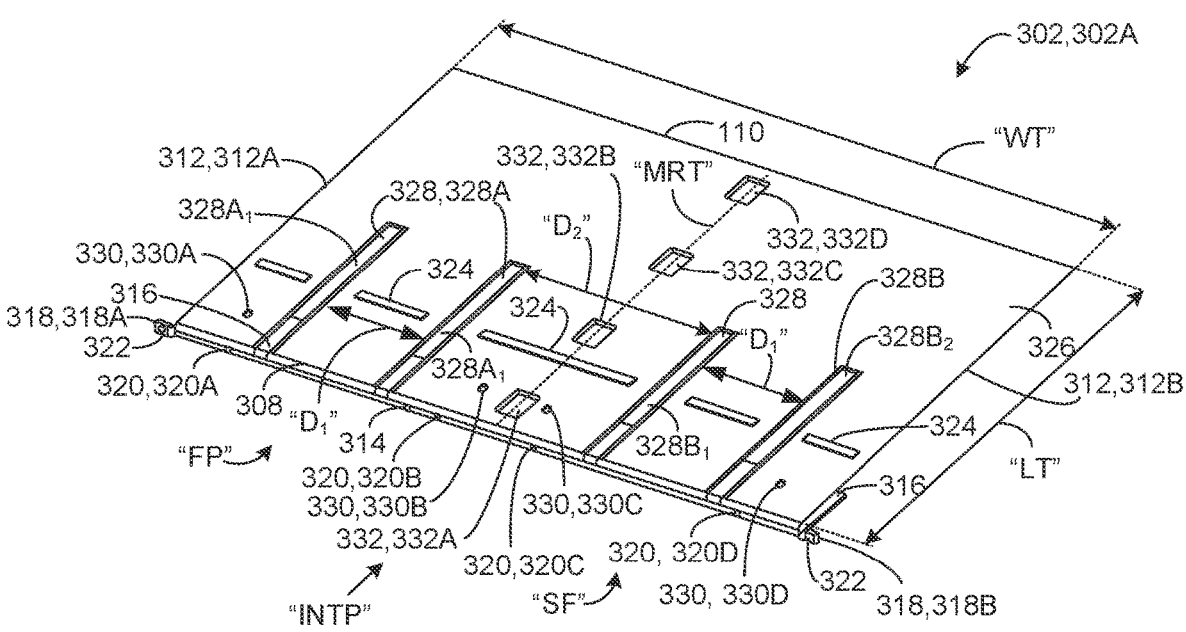
FIG. 3B illustrates a perspective view of a tray of the chassis of FIG. 3A according to an example of the present disclosure.
Figure 3C:
FIG. 3C illustrates a side view of the tray of FIG. 3B according to an example of the present disclosure.
Figure 3D:
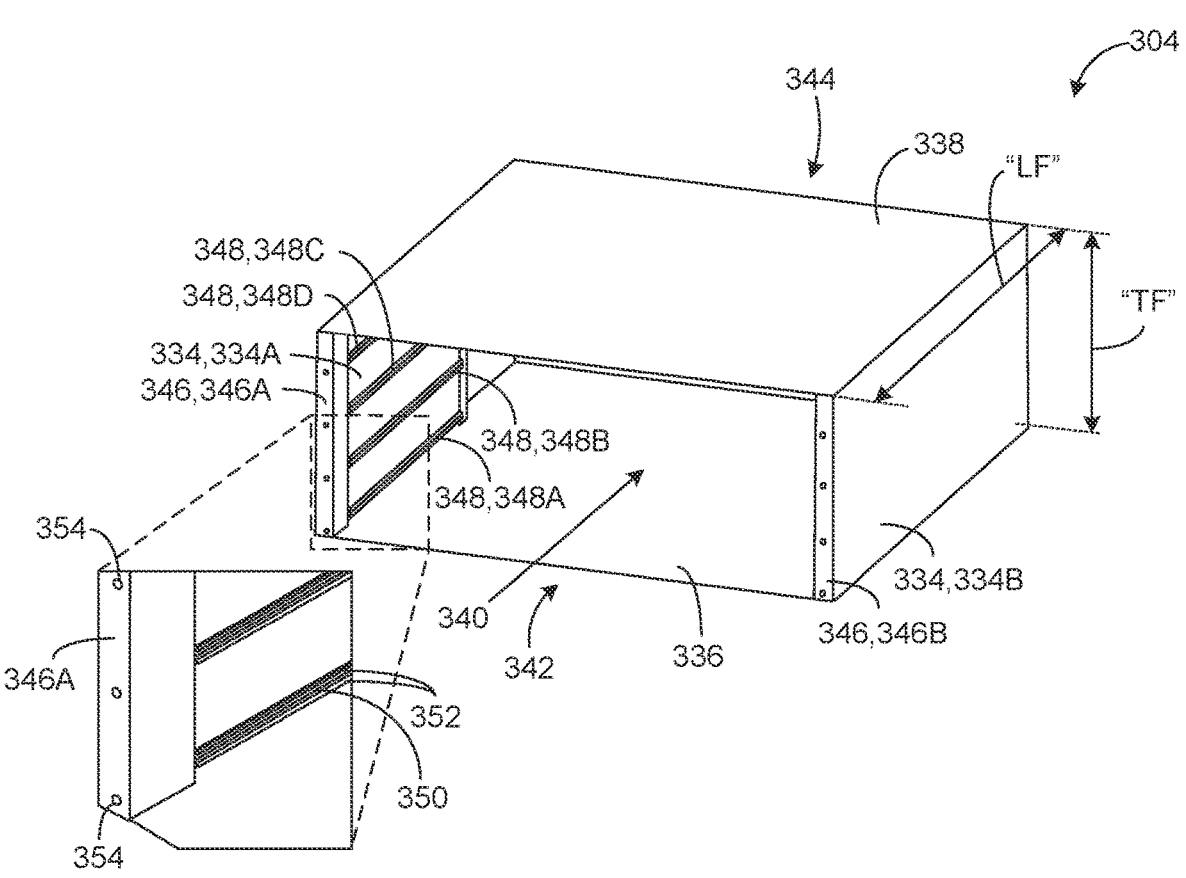
FIG. 3D illustrates a perspective view of frame of the chassis of FIG. 3A according to an example of the present disclosure.

Referring to the Figures, FIG. 3A depicts a perspective view of a chassis 300. FIG. 3B depicts a perspective view of a tray 302 of the chassis 300. FIG. 3C depicts a side view of the tray 302 of FIG. 3B. FIG. 3D depicts a perspective view of a frame 304 of the chassis 300. In the description hereinafter, FIGS. 3A-3D are described concurrently for ease of illustration. It should be understood that each of the Figures, FIGS. 3A-3D is not intended to illustrate specific shapes, dimensions, or other structural details accurately or to scale, and that implementations of the chassis 300 may have different numbers and arrangements of the illustrated components and may also include other parts that are not illustrated.

Figure 4A:
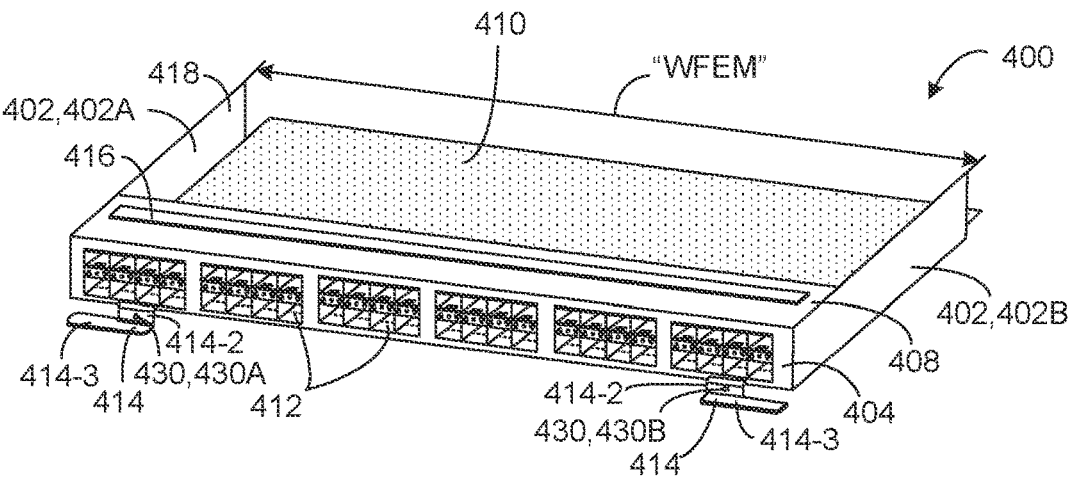
FIG. 4A illustrates a perspective view of a first electronic module of an electronic device according to an example of the present disclosure.
Figure 5A:
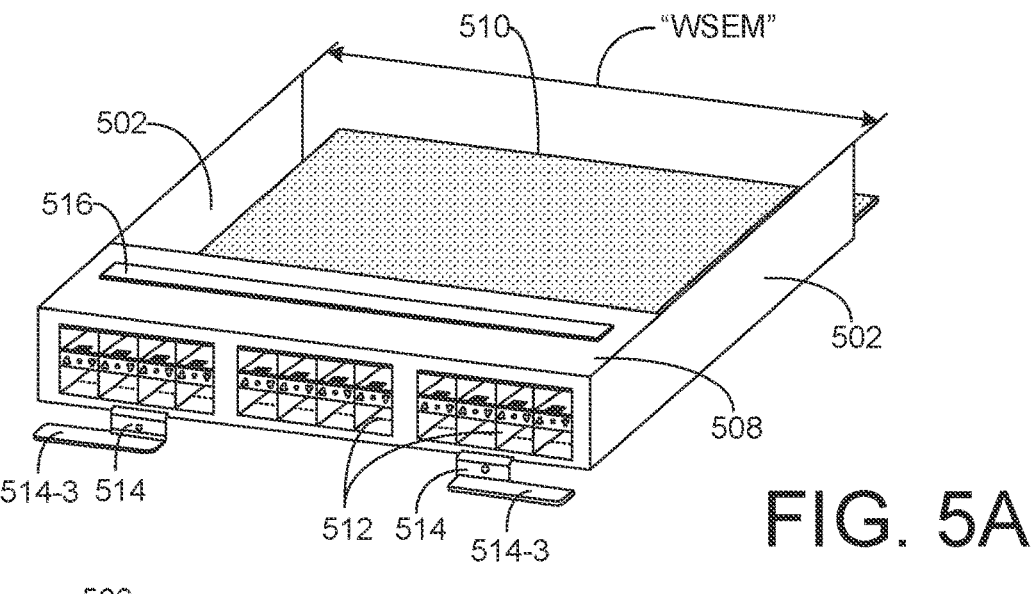
FIG. 5A illustrates a perspective view of a second electronic module of an electronic device according to an example of the present disclosure.
Figure 6A:
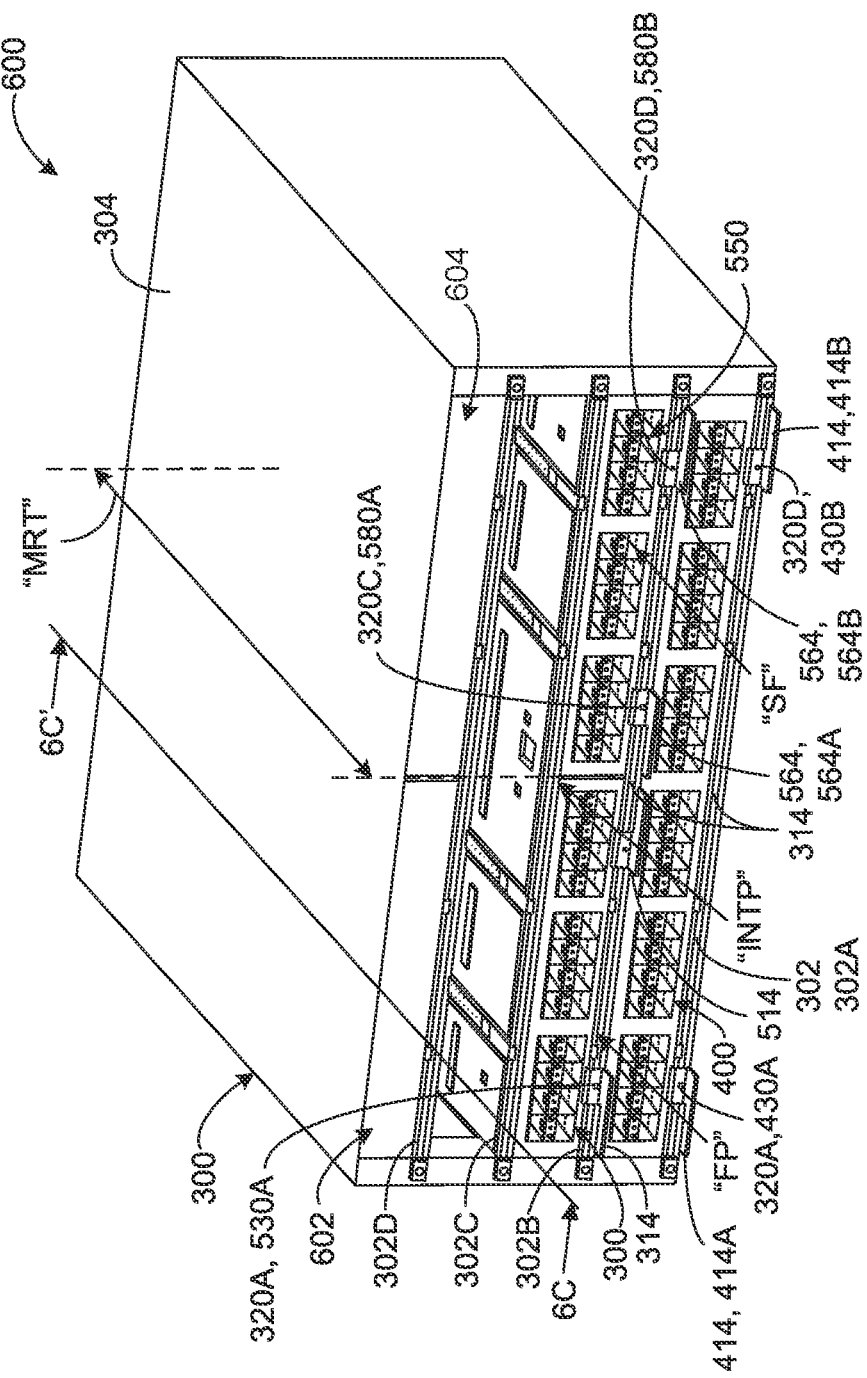
FIG. 6A illustrates a perspective view of an electronic device having a chassis of FIG. 3A, the first electronic module of FIG. 4A, and a second electronic module of FIG. 5A according to an example of the present disclosure.

The chassis 300 may function as an enclosure of an electronic device 600 (e.g., a switch, as shown in FIG. 6A). The chassis 300 may receive one or more electronic modules (e.g., line cards), such as a first electronic module 400 and a second electronic module 500 (as shown in FIGS. 4A, 5A respectively) and provision connection of the first and second electronic modules 400, 500 to a backplane circuit board (not shown) of the electronic device 600. In one or more examples, upon connection of either one or both of the first and second electronic modules 400, 500 to the backplane circuit board, the electronic device 600 may provision communication between a host computing device (e.g., a server) and an external electronic device (e.g., a modem, a switch, a server, or the like).

In one or more examples, the chassis 300 may include trays 302 and a frame 304. Each of the trays 302 may be removably coupled to the frame 304 to allow the chassis 300 to be customized based on the one or more electronic modules having different form factors. It may be noted herein that the chassis 300 may be defined by a length, a width, and a height, as indicated by an orientation legend 10. The chassis 300 shown in FIG. 3A, has four trays 302 (e.g., a first tray 302A, a second tray 302B, a third tray 302C, and a fourth tray 302D). In some other examples, the chassis 300 may have fewer number of trays 302 depending on a configuration of the one or more electronic modules of the electronic device 600. The trays 302 are disposed vertically spaced apart from each other by a height. In some examples, the height may be a 1 unit (1 U) height. In some other examples, some of the trays 302 may be disposed at a 2 U height from each other depending on the height of the one or more electronic modules.

Now referring to FIG. 3B, each of the trays 302 (e.g., the first tray 302A) may be a rectangular shaped side structure configured to receive and retain i) the first electronic module 400 or ii) the second electronic module 500 and/or a third electronic module 550 (as shown in FIG. 6A). In some examples, the tray 302 includes a base 306 having a front portion 308, a rear portion 310, and a pair of side portions 312. In some examples, the base 306 may be configured to seat i) the first electronic module 400 or ii) the second electronic module 500 and/or the third electronic module 550. The tray 302 further includes a rim portion 314 extending downwards from the front portion 308, and an auxiliary base portion 316 extending backwards from the rim portion 314. In particular, the rim portion 314 is positioned perpendicular to the base 306 and the auxiliary base portion 316 is positioned spaced apart and parallel to the base 306. The rim portion 314 has a plurality of first holes 320 disposed spaced apart from each other along a width "WT" of the tray 306. The rim portion 314 as shown in FIG. 3B, has four first holes 320 (e.g., 320A, 320B, 320C, and 320D). Now referring to FIG. 3C, the tray 302 has a "U" shaped side profile. It may be noted that the "U" shaped side profile is defined by a portion of the base 306, the rim portion 314, and the auxiliary base portion 316. The tray 302 further includes a pair of mounting flanges 318 (a first mounting flange 318A and a second mounting flange 318B), where each of the first and second mounting flanges 318A, 318B extends sidewise from a corresponding end of the rim portion 314. Further, each mounting flange 318 has a first bore 322. The tray 302 further includes a plurality of first electro-magnetic gaskets 324 disposed spaced apart from each other along the width "WT". In some examples, each of the plurality of first electro-magnetic gaskets 324 is disposed proximate to the front portion 308 and coupled to a top surface 326 of the base 306. The base 306 as shown in FIG. 3B, has five first electro-magnetic gaskets 324. The base 306 includes a plurality of engagement members 328, a plurality of through-openings 330, and a plurality of mounting recesses 332.

In some examples, the plurality of engagement members 328 are formed on the base 306 and are spaced apart from each other along the width "WT" of the tray 302. In some other examples, the plurality of engagement members 328 may be coupled to the top surface 326 of the base 306. The base 306 as shown in FIG. 3B, has four engagement members 328. Further, each engagement member 328 extends along a length "LT" of the tray 302. For example, each engagement member 328 extends length wise from the front portion 308 towards the rear portion 310 of the tray 302. In some non-limiting examples, each of the plurality of engagement members 328 may extend up to 50% of the length "LT" of the tray 302. In the example of FIG. 3B, each of the plurality of engagement members 328 is a recess (e.g., a track, a groove, a slot, a channel, or the like). In some other examples, each of the plurality of engagement members 328 may be a protrusion (e.g., a flange, a rail, a post, a screw head, or the like). The plurality of engagement members 328 includes a first pair of engagement members 328A and a second pair of engagement members 328B. The first pair of engagement members 328A includes a first engagement member $328A_1$ and a second engagement member $328A_2$. Similarly, the second pair of engagement members 328B includes a third engagement member $328B_1$ and a fourth engagement member $328B_2$. In such examples, the first engagement member $328A_1$ is formed proximate to a first side portion 312A of the pair of side portions 312 and the fourth engagement member $328B_2$ is formed proximate to a second side portion 312B of the pair of side portions 312. In one or more examples, the engagement members (e.g., the first and second engagement members $328A_1$, $328A_2$) of the first pair of engagement members 328A are spaced apart from each other by a first distance "$D_1$". Similarly, the engagement members (e.g., the third and fourth engagement members $328B_1$, $328B_2$) of the second pair of engagement members 328B are also spaced apart from each other by the first distance "$D_1$". However, the first pair of engagement members 328A and the second pair of engagement members 328B are spaced apart from each other by a second distance "$D_2$". In particular, the second engagement member $328A_2$.and the third engagement member $328B_1$.are spaced apart from each other by the second distance "$D_2$". In some examples, the second distance "$D_2$" is greater than the first distance "$D_1$".

The plurality of through-openings 330 are formed on the base 306 and are spaced apart from each other along the width "WT" of the tray 302. The base 306 as shown in FIG. 3B, has four through-openings 330 (e.g., a first through-opening 330A, a second through-opening 330B, a third through-opening 330C, and a fourth through-opening 330D). In some examples, the plurality of through-openings 330 are disposed between the front portion 308 and the plurality of first electro-magnetic gaskets 324. In particular, the first through-opening 330A is disposed between the first side portion 312A and the first engagement member $328A_1$, the second and third through-openings 330B, 330C are disposed between the second and third engagement members $328A_2$, $328B_1$, and the fourth through-opening 330D is disposed between the fourth engagement member $328B_2$ and the second side portion 312B.

The plurality of mounting recesses 332 are formed on the base 306 and spaced apart from each other along the length "LT" of the tray 302. The base 306 as shown in FIG. 3B, has four mounting recesses 332 (e.g., a first mounting recess 332A, a second mounting recess 332B, a third mounting recess 332C, and a fourth mounting recess 332D). In some examples, the plurality of mounting recesses 332 are disposed along a mid-region "MRT" of the tray 302. In particular, the first mounting recess 332A is disposed proximate to the front portion 308 of the tray 302 and the fourth mounting recess 332D is disposed proximate to the rear portion 310 of the tray 302. More particularly, the first mounting recess 332A is disposed between the second and third through-openings 330B, 330C respectively.

In one or more examples, a portion of the tray 302 between the first side portion 312A and the mid-region "MRT" may be referred to as a first position "FP" and another portion of the tray 302 between the mid-region "MRT" and the second side portion 312B may be referred to as a second position "SP". Further, the portion of the tray 302 between the second engagement member $328A_2$ and the third engagement member $328B_1$ may be referred to as an intermediate position "INTP". In other words, the position between the first and second positions "FP" and "SP" may be referred to as the intermediate position "INTP".

Referring to FIG. 3D, the frame 304 includes a pair of side structures 334, a bottom structure 336, and a top structure 338. The pair of side structures, the bottom structure 336, and the top structure 338 are coupled to each other to define the enclosure 340 therebetween a front portion 342 and a rear portion 344 of the frame 304. The frame 304 further includes a pair of mounting columns 346 and a plurality of guide members 348. In some examples, a first mounting column 346A of the pair of mounting columns 346 is disposed at the front portion 342 contacting the bottom and top structures 336, 338 and a first side structure 334A of the pair of side structures 334. Similarly, a second mounting column 346B of the pair of mounting columns 346 is disposed at the front portion 342 contacting the bottom and top structures 336, 338 and a second side structure 334B of the pair of side structures 334 Each of the first and second mounting columns 346A, 346B includes a plurality of second bores 354 spaced apart from each along a thickness (or height) "TF" of the frame 304. For example, the plurality of second bores 354 are spaced apart from each other by a 1 U height. Further, the plurality of guide members 348 are disposed on and coupled to both the first and second side structures 334A, 334B. In particular, the plurality of guide members 348 disposed on each of the first and second side structures 334A, 334B are spaced apart from other along the height "TF" of the frame 304. For example, the plurality of guide members 348 are spaced apart from each other by the 1 U height. Further, each guide member 348 extends along a length "LF" of the frame 304. For example, each guide member 348 extends length wise from the front portion 342 towards the rear portion 344 of the frame 304. In the example of FIG. 3D, each of the first and second side structures 334A, 334B has four guide members 348 (e.g., a first guide member 348A. a second guide member 348B, a third guide member 348C, and a fourth guide member 348D). In some non-limiting examples, each guide member 348 includes a guide channel 350 defined between a pair of bars 352.

Figure 7A:
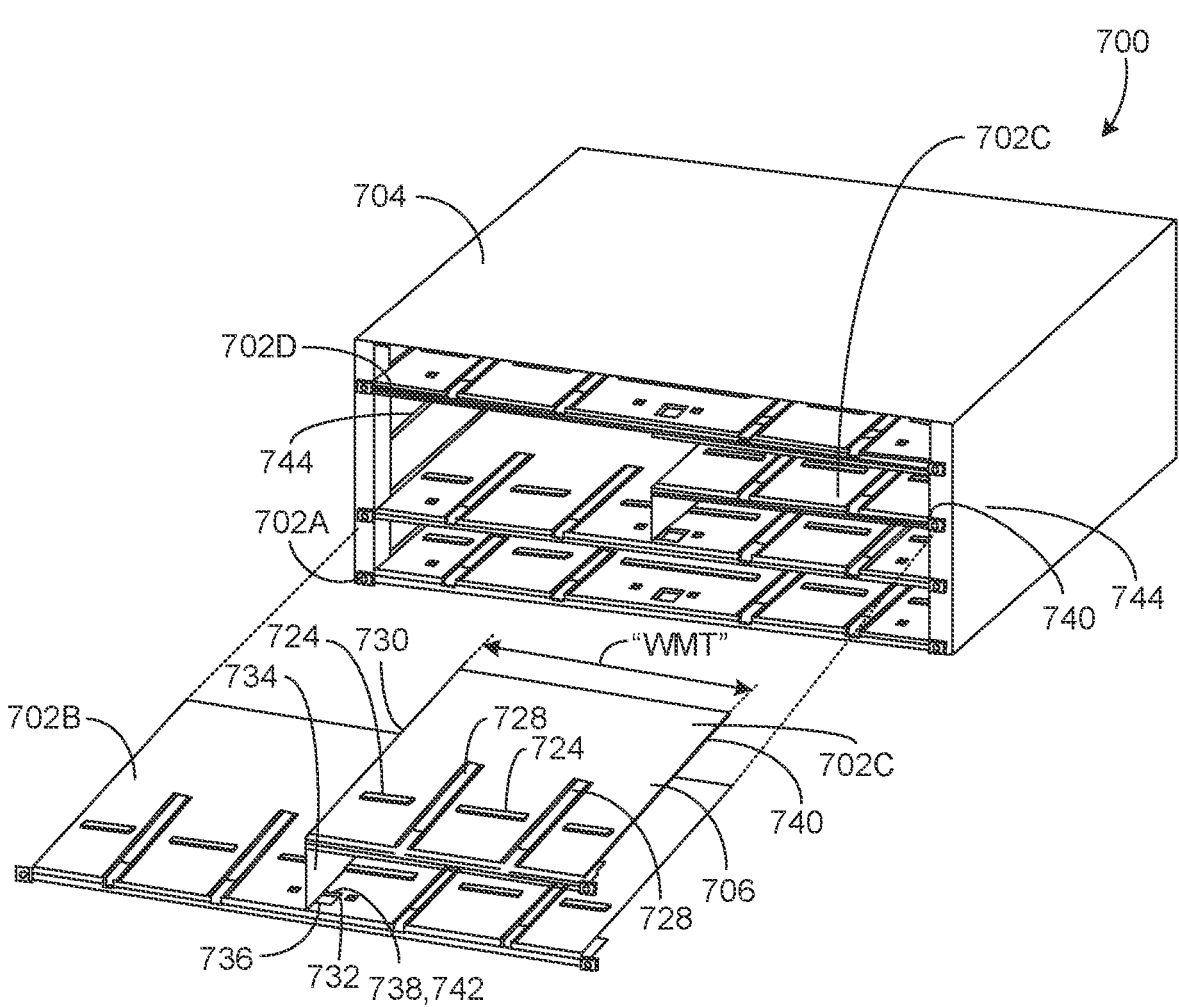
FIG. 7A illustrates a perspective view of a chassis of an electronic device according to another example of the present disclosure.

Referring back to FIG. 3A, each of the trays 302 may be disposed inside the frame 304 by sliding the corresponding tray 302 along a pair of guide members (e.g., the first guide member 348A disposed on each of the first and second side structures 334A, 334B) to form the chassis 300. In other words, the pair of guide members directs each tray 302 to slide into the frame 304 and removably couple to the frame 304 to form the chassis 300. In the example of FIG. 3A, the chassis 300 includes four trays 302A, 302B, 302C, and 302D, each disposed spaced apart from other by 1 U height. In some examples, each of the four trays 302A, 302B, 302C, and 302D have a full-width "WT". In other words, each of the four trays 302A, 302B, 302C, and 302D is a full-width tray. In some other examples, at least some of the four trays 302A, 302B, 302C, and 302D may be a half-width tray or a mezzanine tray 502C (as shown in FIG. 7A). In some examples, when the tray 302 (e.g., the first tray 302A) is inserted into the frame 304, the first mounting flange 318A contacts the first mounting column 346A and the second mounting flange 318B contacts the second mounting column 346B. Further, when the first and second mounting flanges 318A, 318B contact the first and second mounting columns 346A, 346B, the first bore 322 in each of the first and second mounting flanges 318A, 318B is aligned with a corresponding second bore 354 in each of the first and second mounting columns 346A, 346B. In one or more examples, a fastener of a pair of fasteners (not shown) may be extended through the first and second bores 322, 354 to removably couple the tray 302 (e.g., the first tray 302A) to the frame 304. In other words, in a state of the tray 302A being removably disposed between a pair of side structures 334 of the frame 304, the first bore 322 in each of the first and second mounting flange 318A, 318B is aligned to the second bore 354 formed in a corresponding side structure 334A, 334B of the pair of side structures 334 to receive a fastener of a pair of fasteners and removably couple the first tray 302A to the frame 304.

Figure 4B:
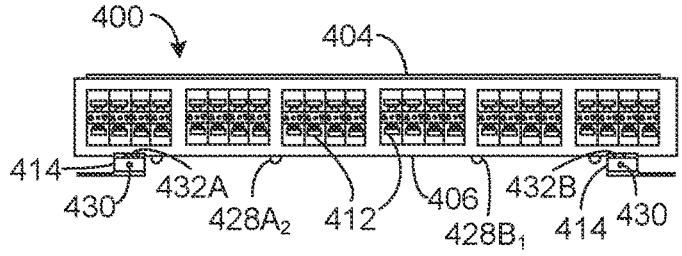
FIG. 4B illustrates a front view of the first electronic module of FIG. 4A according to an example of the present disclosure.
Figure 4C:
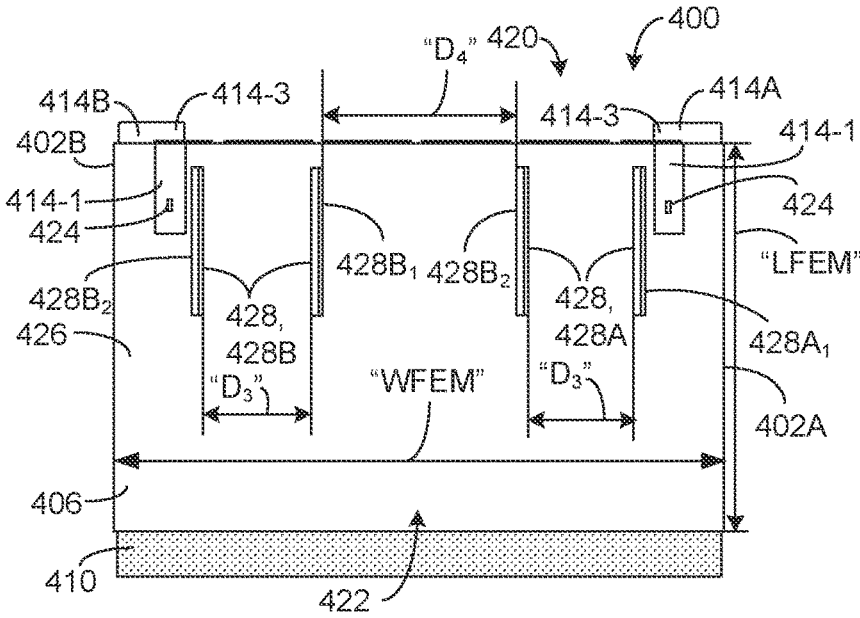
FIG. 4C illustrates a bottom view of the first electronic module of FIG. 4A according to an example of the present disclosure.

FIG. 4A depicts a perspective view of a first electronic module 400. FIG. 4B depicts a front view of the first electronic module 400 of FIG. 4A. FIG. 4C depicts a bottom view of the first electronic module 400 of FIG. 4A. In the description hereinafter, FIGS. 4A-4C are described concurrently for ease of illustration. It should be understood that each of the Figures, FIGS. 4A-4C is not intended to illustrate specific shapes, dimensions, or other structural details accurately or to scale, and that implementations of the first electronic module 400 may have different numbers and arrangements of the illustrated components and may also include other parts that are not illustrated.

In some examples, the first electronic module 400 is a line card. In some non-limiting examples, the first electronic module 400 may be a solid state drive, server, or the like. In some examples, the first electronic module 400 has a pair of side walls 402, a front wall 404, a bottom portion 406, a cover portion 408, a circuit board 410, a plurality of ports 412, a pair of latches 414, and a second electro-magnetic gasket 416. The pair of side walls 402, the front wall 404, the bottom portion 406, and the cover portion 408 are coupled to each other to define a housing 418 of the first electronic module 400. The circuit board 410 is disposed on and coupled to the bottom portion 406. Each of the plurality of ports 412 (e.g., Ethernet port) is coupled to the front wall 404 such that an opening in the corresponding port 412 faces an external environment to receive a compatible connector (not shown). Further, each of the plurality of ports 412 are electrically connected to the circuit board 410. Accordingly, when the compatible connector is connected to one of the plurality of ports 412, the first electronic module 400 may establish a communication between an electronic device (e.g., blade server, not shown) connected to the circuit board 410 of the first electronic device 20 and another electronic device (e.g., modem, not shown) connected to the compatible connector.

The bottom portion 406 has a plurality of complementary engagement members 428. In some examples, the plurality of complementary engagement members 428 are formed on the bottom portion 406 and are spaced apart from each other along a first width "WFEM" of the first electronic module 400. It may be noted that the first width "WFEM" may a full-width of the first electronic module 400. In some other examples, the plurality of complementary engagement members 428 may be coupled to the bottom surface 426 of the bottom portion 406. The bottom portion 406 as shown in FIG. 4C, has four complementary engagement members 428. Further, each complementary engagement member 428 extends along a length "LFEM" of the first electronic module 400. For example, each complementary engagement member 428 extends length wise between a front portion 420 and a rear portion 422 of the first electronic module 400. In some non-limiting examples, each of the plurality of complementary engagement members 428 may extend up to 50% of the length "LFEM" of the first electronic module 400. In the example of FIG. 4C, each of the plurality of complementary engagement members 428 is a protrusion (e.g., a flange, a rail, a post, a screw head, or the like). In some other examples, each of the plurality of complementary engagement members 428 may be a recess (e.g., a track, a groove, a slot, a channel, or the like). The plurality of complementary engagement members 428 includes a first pair of complementary engagement members 428A and a second pair of complementary engagement members 428B. The first pair of complementary engagement members 428A includes a first complementary engagement member $428A_1$ and a second complementary engagement member $428A_2$. Similarly, the second pair of complementary engagement members 428B includes a third complementary engagement member $428B_1$ and a fourth complementary engagement member $428B_2$. In such examples, the first complementary engagement member $428A_1$ is formed proximate to a first side wall 402A of the pair of side walls 402 and the fourth complementary engagement member 428B2 is formed proximate to a second side wall 412B of the pair of side walls 402. In one or more examples, the complementary engagement members (e.g., the first and second complementary engagement members $428A_1$, $428A_2$) of the first pair of complementary engagement members 428A are spaced apart from each other by a third distance "Ds". Similarly, the complementary engagement members (e.g., the third and fourth complementary engagement members $428B_1$, $428B_2$) of the second pair of complementary engagement members 428B are also spaced apart from each other by the third distance "$D_3$". However, the first pair of complementary engagement members 428A and the second pair of complementary engagement members 428B are spaced apart from each other by a fourth distance "$D_4$". In particular, the second complementary engagement member $428A_2$.and the third complementary engagement member $428B_1$.are spaced apart from each other by the fourth distance "$D_4$". In some examples, the fourth distance "$D_4$" is greater than the third distance "$D_3$". However, the fourth distance "$D_4$" is equal to second distance "$D_2$" between the first pair of engagement members 328A and the second pair of engagement members 328B of the tray 302 (as shown in FIG. 3B). Similarly, the third distance "$D_3$" is equal to first distance "D" between the engagement members 328 of each of the first and second pair of engagement members 328A, 328B of the tray 302.

The pair of latches 414 includes a first latch 414A and a second latch 414B. Each of the first latch 414A and the second latch 414B includes a latching portion 414-1, a lifting portion 414-2, and a locking portion 414-3 interconnecting the latching and locking portions 414-1, 414-3. The locking portion 414-2 extends downwards from the latching portion 414-1, and the lifting portion 414-3 extends sidewise from the locking portion 414-2. In particular, the locking portion 414-2 is positioned perpendicular to the latching portion 414-1, and the lifting portion 414-3 is positioned parallel to the latching portion 414-1. In some examples, the first latch 414A is located between the first side wall 402A and the first complementary engagement member 428A₁ and the second latch 414B is located between the second side wall 402B and the fourth complementary engagement member 428B₂. In particular, the first latch 414A is disposed in a first cut-out 432A formed in the front wall 404 and a second cut-out 432B is disposed in the second cut-out 432B formed in the front wall 404 such that the latching portion 414-1 contacts the bottom portion 406, the locking portion 414-2 protrudes vertically downwards from the bottom portion 406, and the lifting portion 414-3 protrudes outwards from the front wall 404. In such examples, a free end of the latching portion 414-1 may be further coupled to the bottom portion 406 to retain the corresponding latch of the pair of latches 414 to the first electronic module 400. In one or more examples, the latching portion 414-1 includes a prong 424 that protrudes vertically downwards from the latching portion 414-1. The lifting portion 414-3 can be lifted to allow the prong 424 in the latching portion 414-1 to move upwards. In some examples, in a state of the one or more electronic modules (e.g. the first electronic module 400) being mounted on the base 306 of the tray 302, the prong 424 formed on each latch of a plurality of latches 414 engages with a corresponding through-opening of the plurality of through-openings 330 to retain the one or more electronic modules in the tray 302. Further, the locking portion 414-2 of each latch of the pair of latches 414 has a second hole 430. In other words, the pair of latches 414 has two second holes (e.g., 430A, 430B). In some examples, the second electro-magnetic gasket 416 extends along the first width "WFEM" of the first electronic module 400. In particular, the second electro-magnetic gasket 416 is disposed on and coupled to the cover portion 408 of the first electronic module 400. In some examples, in the state of the one or more electronic modules (e.g., the first electronic module 400) being mounted to the tray 302, the second hole 430 formed on each latch of the plurality of latches 414 is aligned with a corresponding first hole of the plurality of first holes 320 to receive a fastener of a plurality of fasteners and lock the one or more electronic modules to the tray 302.

Figure 5B:
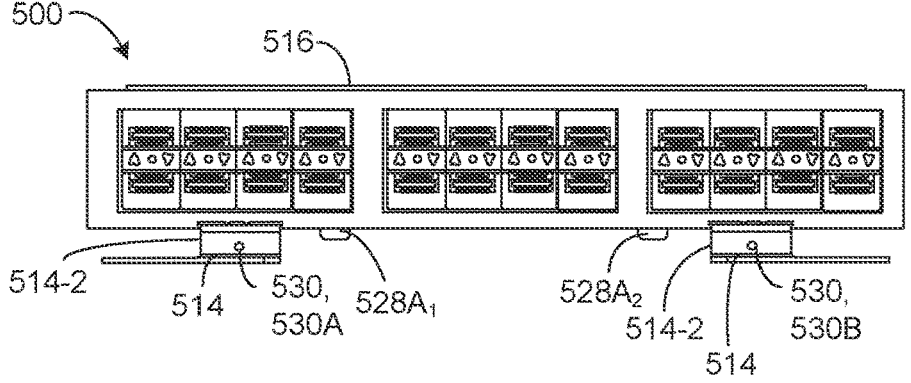
FIG. 5B illustrates a front view of the second electronic module of FIG. 5A according to an example of the present disclosure.
Figure 5C:
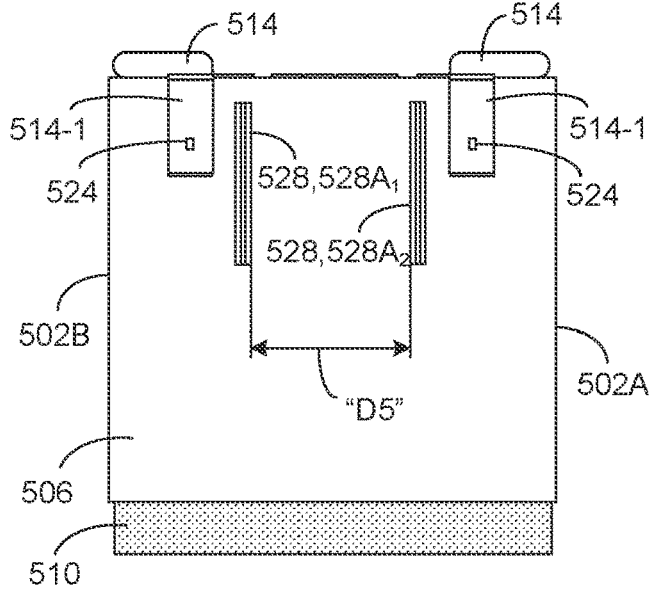
FIG. 5C illustrates a bottom view of the second electronic module of FIG. 5A according to an example of the present disclosure.

FIG. 5A depicts a perspective view of a second electronic module 500. FIG. 5B depicts a front view of the second electronic module 500 of FIG. 5A. FIG. 5C depicts a bottom view of the second electronic module 500 of FIG. 5A. In the description hereinafter, FIGS. 5A-5C are described concurrently for ease of illustration. It should be understood that each of the Figures, FIGS. 5A-5C is not intended to illustrate specific shapes, dimensions, or other structural details accurately or to scale, and that implementations of the second electronic module 500 may have different numbers and arrangements of the illustrated components and may also include other parts that are not illustrated.

The second electronic module 500 is a line card. The second electronic module 500 has a pair of side walls 502, a front wall 504, a base 506, a cover portion 508, a circuit board 510, a plurality of ports 512, a pair of latches 514, and a second electro-magnetic gasket 516. The second electronic module 500 is substantially similar to the first electronic module 400, other than a second width "WSEM" of the second electronic module 500, which is half to that the first width "WFEM" of the second electronic module 400. Further, the base 506 of the second electronic module 500 includes a plurality of complementary engagement members 528 e.g., two complementary engagement members rather than four complementary engagement members as shown in the bottom portion 406 of the first electronic module 400. In particular, the plurality of complementary engagement members 528 includes a first complementary engagement member 528A₁ and a second complementary engagement member 528A₂. In such examples, the first complementary engagement member 528A₁ and the second complementary engagement member 528A₂ are spaced apart from each other along the second width "WSEM" of the second electronic module 500 by a fifth distance "$D_5$". In some examples, the fifth distance "$D_5$" is equal to the first distance "$D_1$" as shown in FIG. 3B and third distance "Ds" as shown in FIG. 4C. Further, the pair of latches 514 includes a first latch 514A and a second latch 514B. In some examples, the first latch 514A is located between a first side wall 502A and the first complementary engagement member 528A₁ and the second latch 514B is located between a second side wall 502B and the second complementary engagement member 528A₂. As discussed herein, each of the first latch 514A and the second latch 514B includes a latching portion 514-1, a lifting portion 514-2, and a locking portion 514-3 interconnecting the latching and locking portions 514-1, 514-3. In one or more examples, the latching portion 514-1 of each latch of the pair of latches 514 includes a prong 524 that protrudes vertically downwards from the latching portion 514-1. Further, the locking portion 514-2 of each latch of the pair of latches 514 has a second hole 530.

Figure 6B:
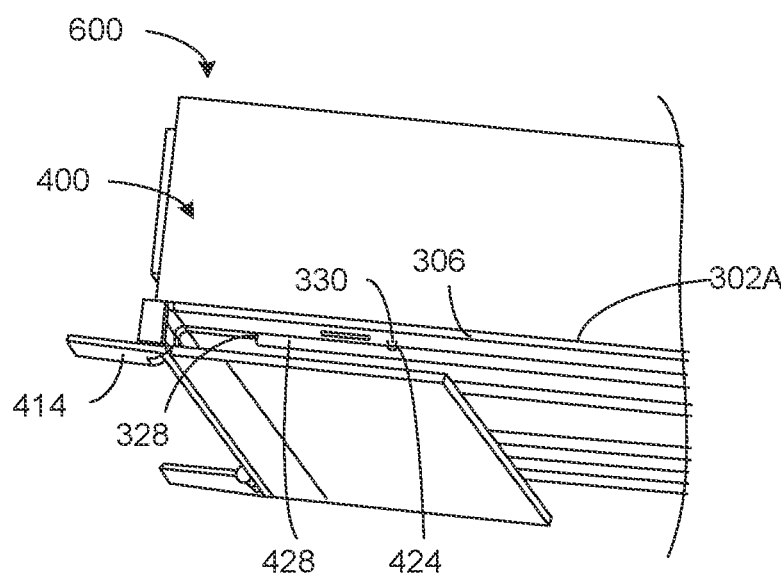
FIG. 6B illustrates a bottom view of the electronic device of FIG. 6A according to an example of the present disclosure.
Figure 6C:
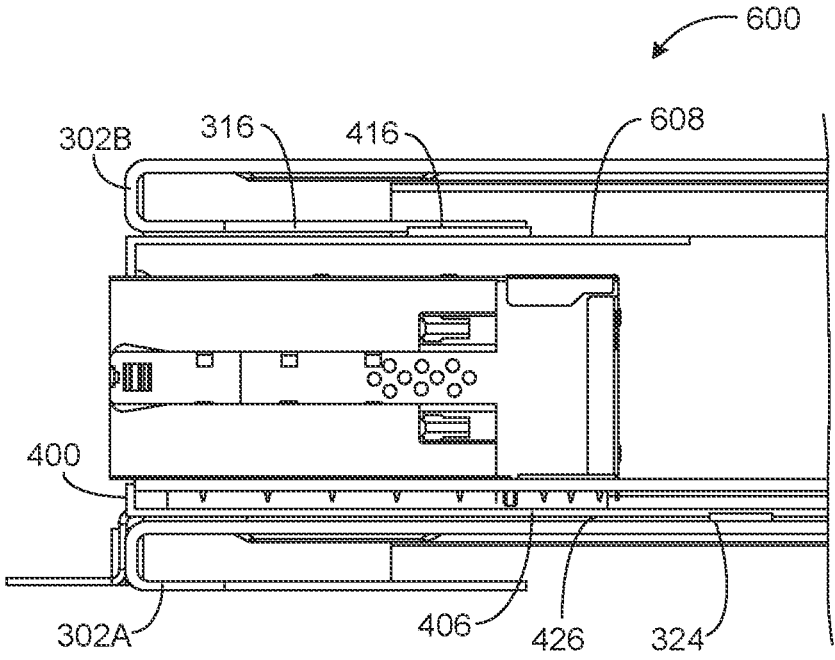
FIG. 6C illustrates a cross-sectional view of a portion of the electronic device of FIG. 6A taken along line 6C-6C' in FIG. 6A according to an example of the present disclosure.

FIG. 6A depicts a perspective view of an electronic device 600. FIG. 6B depicts a side view of a portion of the electronic device 600 of FIG. 6A. FIG. 6C depicts a portion of a cross-sectional view of the electronic device 600 taken along a line 6C-6C' of FIG. 6A. In the description hereinafter, FIGS. 6A-6C are described concurrently for ease of illustration. It should be understood that each of the Figures, FIGS. 6A-6C is not intended to illustrate specific shapes, dimensions, or other structural details accurately or to scale, and that implementations of the electronic device 600 may have different numbers and arrangements of the illustrated components and may also include other parts that are not illustrated.

In some examples, the electronic device 600 may be a networking device, e.g., a switch. In some non-limiting examples, the electronic device 600 may be a storage device, a computing device, or the like. The electronic device 600 includes a chassis 300, a first electronic module 400, a second electronic module 500, a third electronic module 550, a first management module 602, and a second management module 604.

As discussed in the example of FIGS. 3A-3D, the chassis 300 includes trays 302 (e.g., a first tray 302A, a second tray 302B, a third tray 302C, and a fourth tray 302D) and a frame 304. Each of the trays 302 includes a plurality of engagement members 328 (as labeled in FIG. 6B). In some examples, the plurality of engagement members 328 has a first pair of engagement members 328A and a second pair of engagement members 328B. The trays 302 are disposed spaced apart from each other by a 1 U height and removably coupled to the frame 304. Thus, each tray 302 may be configured to mount one or more electronic modules (e.g., line cards) having i) a 1 U height and ii) a full-width (e.g., the first electronic module 400) or two electronic modules, each having half-width (e.g., the second and third electronic modules 500, 550).

Further, as discussed in the example of FIGS. 4A-4C, the first electronic module 400 has a pair of side walls 402, a front wall 404, a bottom portion 406, a cover portion 408, a circuit board 410, a plurality of ports 412, a pair of latches 414, and a second electro-magnetic gasket 416. The bottom portion 406 includes a plurality of complementary engagement members 428 (as labeled in FIG. 6B). In some examples, the plurality of complementary engagement members 428 has a first pair of complementary engagement members 428A and a second pair of complementary engagement members 428B. It may be noted that the Figure, FIG. 6B does not illustrate the frame 304 for ease of illustration of the first electronic module 400 and the first tray 302A and such illustration should not be construed as a limitation of the present disclosure. In some examples, the first electronic module 400 is slidably pushed inside the frame 304 of the chassis 300 to mount the first electronic module 400 to the first tray 302A. Referring to FIG. 6B, in particular, when the first electronic module 400 is slidably pushed into the first tray 302A, the first complementary engagement members 428 of the first electronic module 400 engages with the plurality of engagement members 328 of the first tray 302A to mount the first electronic module 400 to the first tray 302A. In some other examples, at least some of the plurality of engagement members 328 are configured to engage with the complementary engagement members 428 to mount the first electronic module 400 to the first tray 302A. In such examples, when the first electronic module 400 is mounted to the first tray 302A, the circuit board 410 (as labeled in FIG. 4A) of the first electronic module 400 may be connected to a backplane circuit board (not shown) of the electronic device 600 to establish electrical connection between the electronic device 600 and the first electronic module 400. Further, when the first electronic module 400 is mounted to the first tray 302A, a prong 424 in each latch 414 of the first electronic module 400 is engaged to a corresponding through-opening 330 of the first tray 302A to retain the first electronic module 400 in the first tray 302A. Referring back to the FIG. 6A, when the first electronic module 400 is mounted to the first tray 302A, each of the pair of latches 414 is disposed on the rim portion 314 of the first tray 302A such that the first hole 430A of the first latch 414A is aligned with the second hole 320A of the rim portion 314, and the other first hole 430B of the second latch 414B is aligned with the other second hole 320D of the rim portion 314. In such examples, a fastener of a pair of fasteners (not shown) may extend through corresponding first and second holes 320A, 430A and 320D, 430B to lock the first electronic module 400 to the chassis 300.

In some examples, the first electronic module 400 may be removed from the chassis 300. For example, first each fastener of the pair of fasteners is unfastened from the corresponding first and second holes 320A, 430A and 320D, 430B. Further, each latch of the pair of latches 414 may be lifted to allow the prong 424 to disengage from the corresponding through-opening 330. Further, the first electronic module 400 may be slidably pulled from the first tray 302A to disengage the first complementary engagement members

428 from the at least some of the plurality of engagement members 328 to remove the first electronic module 400 from the chassis 300.

Further, as discussed in the example of FIGS. 5A-5C, the second electronic module 500 has a pair of side walls 502, a front wall 504, a base 506, a cover portion 508, a circuit board 510, a plurality of ports 512, a pair of latches 514, and a second electro-magnetic gasket 516. The base 506 includes a plurality of complementary engagement members 528 (as labeled in FIG. 5C). In some examples, the second electronic module 500 is slidably pushed inside the frame 304 of the chassis 300 to mount the second electronic module 500 to the second tray 302B. In particular, the second electronic module 500 is slidably pushed into the second tray 302B in a first position "FP". In such examples, when the second electronic module 500 is slidably pushed into the second tray 302B, the complementary engagement members 528 engages with the first pair of engagement members 328A (as shown in FIG. 3B) of the second tray 302B to mount the second electronic module 500 to the second tray 302B. In such examples, when the second electronic module 500 is mounted to the second tray 302B, the circuit board 510 (as labeled in FIG. 5A) of the second electronic module 500 may be connected to the backplane circuit board (not shown) of the electronic device 600 to establish electrical connection between the electronic device 600 and the second electronic module 500. Further, when the second electronic module 500 is mounted to the second tray 302B, a prong 524 (as shown in FIG. 5C) in each latch 514 of the second electronic module 500 is engaged to a corresponding through-opening 330 of the second tray 302B to retain the second electronic module 500 in the second tray 302B. Further, when the second electronic module 500 is mounted to the second tray 302B, each latch of the pair of latches 514 is disposed on the rim portion 314 of the second tray 302B such that the first hole 530A of the first latch 514A is aligned with the second hole 320A of the rim portion 314, and the other first hole 530B of the second latch 514B is aligned with the other second hole 320B of the rim portion 314 of the second tray 302B. In such examples, a fastener of a pair of fasteners (not shown) may extend through corresponding first and second holes 320A, 530A and 320B, 530B to lock the second electronic module 500 to the chassis 300.

In one or more examples, the third electronic module 550 may be similar to the second electronic module 500. Therefore, for the sack of brevity of description, the third electronic module 550 is not discussed in detail, and such non-description of the third electronic module 550 should not be construed as a limitation of the present disclosure. In some examples, the third electronic module 550 may include a pair of side walls, a front wall, a base, a cover portion, a circuit board, a plurality of ports, a pair of latches 564, and a second electro-magnetic gasket. In such examples, the base of the third electronic module 550 may include a plurality of complementary engagement members. In some examples, the third electronic module 550 is slidably pushed into the frame 304 of the chassis 300 to mount the third electronic module 550 to the second tray 302B. In particular, the third electronic module 550 is slidably pushed into the second tray 302B in a second position "SP". In such examples, when the third electronic module 550 is slidably pushed into the second tray 302B, the complementary engagement members of the third electronic module 550 may engage with the second pair of engagement members 428B (as shown in FIG. 3B) of the second tray 302B to mount the third electronic module 550 to the second tray 302B. Accordingly, in such examples, the second and third electronic modules 500, 550 are disposed adjacent to each other along the mid-region "MRT" of the chassis 300. Since each of the second and third electronic modules 500, 550 has a half-width, the second tray 302B may be able to mount the second and third electronic modules 500, 550 in the first and second positions "FP", "SP" respectively. In such examples, when the third electronic module 550 is mounted to the second tray 302B in the second position, the circuit board 510 (as labeled in FIG. 5A) of the third electronic module 550 may be connected to the backplane circuit board (not shown) of the electronic device 600 to establish electrical connection between the electronic device 600 and the third electronic module 550. Further, when the third electronic module 550 is mounted to the second tray 302B, a prong in each latch 514 of the third electronic module 550 may be engaged to a corresponding through-opening 330 of the second tray 302B to retain the third electronic module 550 in the second tray 302B. Further, when the third electronic module 550 is mounted to the second tray 302B, each latch 514 may be disposed on the rim portion 314 of the second tray 302B such that a first hole 580A of a first latch 564A is aligned with the second hole 320C of the rim portion 314, and another first hole 580B of a second latch 564B is aligned with the other second hole 320D of the rim portion 314 of the second tray 302B. In such examples, a fastener of a pair of fasteners (not shown) may extend through corresponding first and second holes 320C, 580A and 320D, 580B to lock the third electronic module 550 to the chassis 500.

In some examples, the plurality of engagement members 528 prevents mounting of the second electronic module 500 or the third electronic module 550 to the tray 302 in an intermediate position "INTP". In some examples, the intermediate position "INTP" may be a position between the first position "FP" and the second position "SP". In other words, the plurality of engagement members 328 prevents mounting of the second electronic module 500 or the third electronic module 550 to the tray 302 in any position other than the first position "FP" and the second position "SP". In particular, the second engagement member $328A_2$ and the third engagement member $328B_1$ may prevent mounting of the second electronic module 500 or the third electronic module 550 to the tray 302 in the intermediate position "INTP". Since the complementary engagement members of each of the second and third electronic modules 500, 550 are disposed spaced apart from each other by the fifth distance "$D_5$" and the second engagement member $328A_2$ and the third engagement member $328B_1$ of the tray 302 are spaced apart from each other by the second distance "$D_2$", which is greater than the fifth distance "$D_5$", each of the second and third electronic modules 500, 550 cannot be mounted to the tray 302 in the intermediate position "INTP".

Referring to FIG. 6C, when the first electronic module 400 is mounted to the first tray 302A, the plurality of first electro-magnetic gaskets 324 disposed on the first tray 302A contacts a bottom portion 406 of the first electronic module 400 and the second electro-magnetic gasket 416 disposed on the cover portion 408 of the first electronic module contacts the auxiliary base portion 316 of the second tray 302B, to discharge electrostatic energy stored in the first electronic module 400 to the first tray 302A and the second tray 302B respectively. Thus, the plurality of first electro-magnetic gaskets 324 and the second electro-magnetic gasket 416 may prevent an electromagnetic interference (EMI) noise from radiating through the first electronic module 400.

In the example of FIG. 6A, the third tray 302C is kept empty. However, the third tray 302C may mount either one of a full-width electronic module (e.g., another first electronic module 400) or two half-width electronic modules (e.g., another second electronic module 500 and another third electronic module 550). Further, in the example of FIG. 6C, the first and second management modules 602, 604 is mounted on the fourth tray 302D, The first and second management modules 602, 604 may be electrically connected to the backplane circuit board of the electronic device 600 and to each of the first, second, and third electronic modules 400, 500, 550 to regulate the operations of such electronic modules.

Figure 7B:
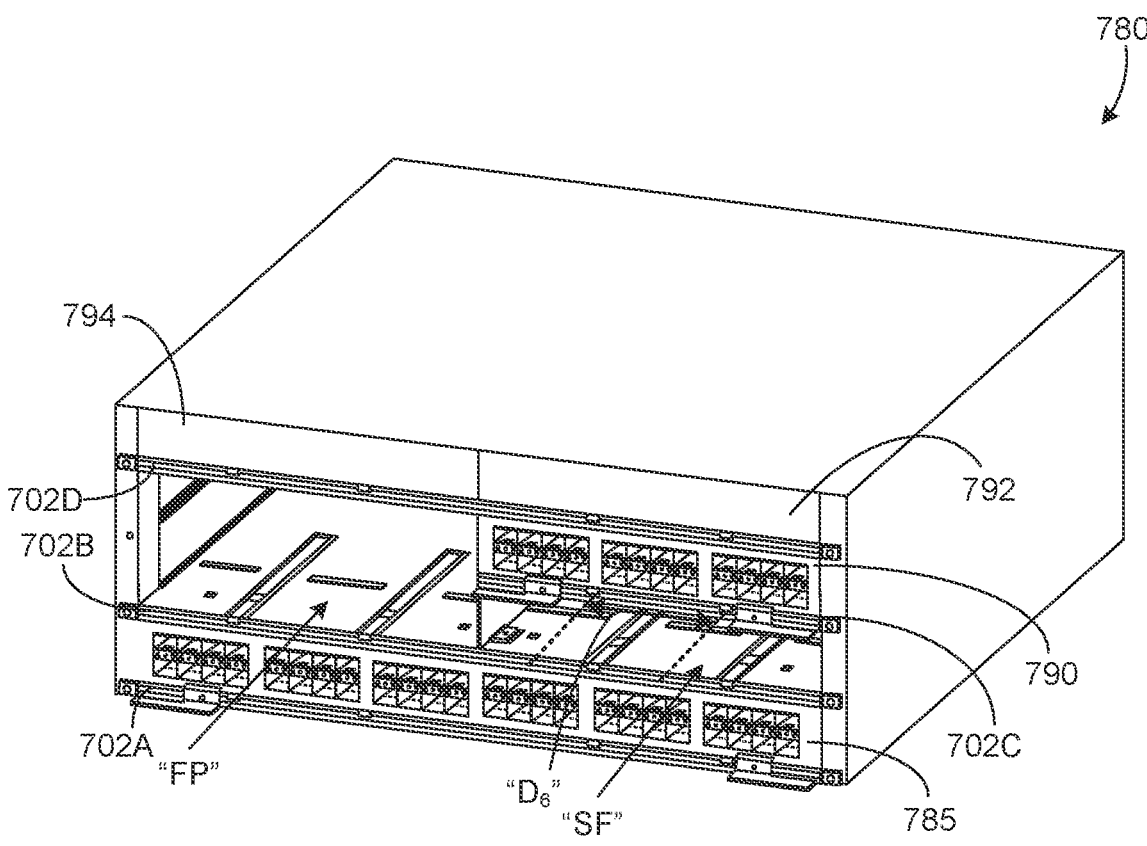
FIG. 7B illustrates a perspective view of the electronic device having the chassis of FIG. 7A, a first electronic module and a second electronic module according to another example of the present disclosure.

FIG. 7A depicts a perspective view of a chassis 700. FIG. 7B depicts a perspective view of an electronic device 780 having a chassis 700 of FIG. 7A, a first electronic module 785, and a fourth electronic module 790. In the description hereinafter, FIGS. 7A-7B are described concurrently for ease of illustration.

The chassis 700 includes a trays 702 and a frame 704. The trays 702 includes a first tray 702A, a second tray 702B, a third tray (e.g., a mezzanine tray 702C), and a fourth tray 702D. The first, second, and fourth trays 702A, 702B, and 702D are similar to the first, second, and fourth trays 302A, 302B, and 302D as discussed in the example of FIGS. 3A-3D. Further, the frame 704 is similar to the frame 304 of FIG. 3A. Hence, the first, second, and fourth trays 302A, 302B, and 302D and the frame 704 are not discussed in greater details herein.

The mezzanine tray 702C has a third width "WMT" that is equal to half of a width of the first tray, second tray, or fourth tray 702A, 702B, 702D. In other words, the third width "WMT" of the mezzanine tray 702C is either half of a first width "WFEM" of the first electronic module 785 or equal to a second width "WSEM" of the fourth electronic module 790. In some examples, the mezzanine tray 702C includes a base 706 having a plurality of first electro-magnetic gaskets 724 and a pair of engagement members (e.g., a third pair of engagement members 728). In one or more examples, engagement members of the third pair of engagement members 728 are spaced apart from each other by the first distance "$D_1$". In one or more examples, the first distance "$D_1$" may be equal to a fifth distance "$D_5$" between complementary engagement members 528 of a second electronic module 500 (as shown in FIG. 5C) or equal to a sixth distance "$D_6$" between complementary engagement members of the fourth electronic module 790. The base 706 has a first end 730 and a second end 740, which are opposite to each other. In some examples, the first end 730 is coupled to the second tray 702B via a support beam 734. In some examples, the support beam 734 has a 1 U height and extends downwards perpendicularly from the first end 730. In particular, the support beam 734 has a plurality of mounting protrusions 736, each extends sidewise from the support beam 734 and seats on a corresponding mounting recess of a plurality of mounting recesses 732 of the second tray 702B. In one or more examples, each mounting recess 732 and each mounting protrusion 736 has a first opening 738 and a second opening 742 respectively. In such examples, a fastener among a plurality of fasteners (not shown) may extend through the first and second openings 738, 742 respectively to couple the support beam 734 to the second tray 702B. In one or more examples, the second end 740 is coupled to one of a pair of side structures 744 of the frame 704, as discussed herein in the example of FIGS. 3A-3D.

Now referring to FIG. 7B, the first electronic module 785 is mounted to the first tray 702A as discussed herein the example of FIG. 6A. Further, a fourth electronic module 790 having a 1 U and half-width is mounted to the mezzanine tray 702C. In some examples, when the fourth electronic module 790 is mounted to the mezzanine tray 702C, the third pair of engagement members 728 of the mezzanine tray 702C engages to a fourth pair of complementary engagement members (not shown) of the fourth electronic module 790 to mount the fourth electronic module 790 to the mezzanine tray 702C. In one or more examples, a second electronic module having a half-width and a 2 U height may be mounted to the second tray 702B at a first position "FP" and a third electronic module having a half-width and a 1 U height may be mounted to the second tray 702B at a second position "SP". The electronic device 780 further includes a first management module 792 and a second management module 794 mounted to the fourth tray 702D at the first position "FP" and the second position "SP" respectively. In some examples, the first and second management modules 792, 794 may be electrically connected to a backplane circuit board of the electronic device 780 and to each of the first electronic module 785, the fourth electronic module 790 to regulate the operations of such electronic modules.

Figure 8:
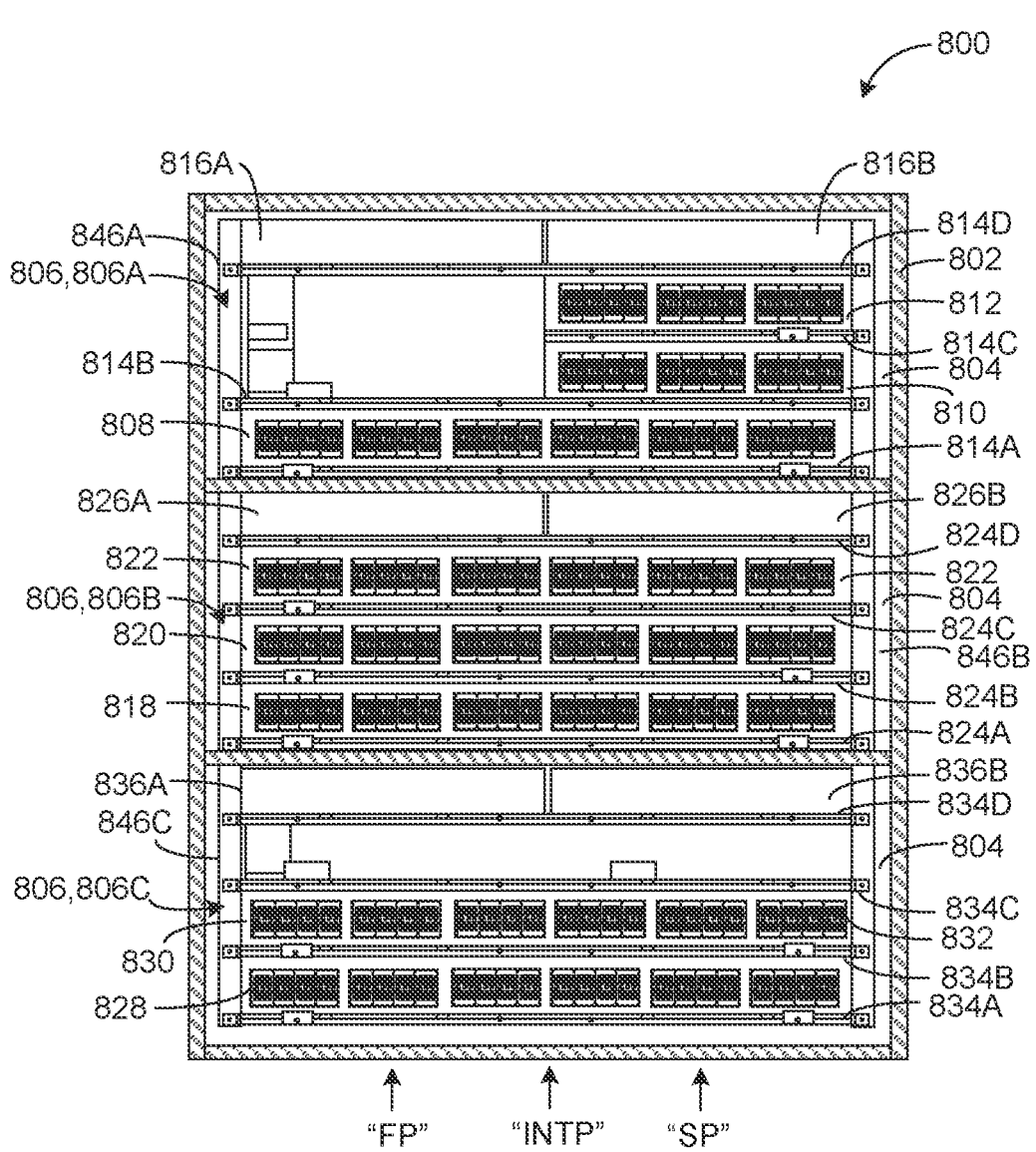
FIG. 8 illustrates a block diagram of an electronic system having a rack, a first electronic device, a second electronic device, and a third electronic device according to an example of the present disclosure.

FIG. 8 depicts a perspective view of an electronic system 800 (e.g., a networking system) of a data center environment. The electronic system 800 includes a rack 802 having a plurality of enclosures 804 to allow mounting of a plurality of electronic devices 806 into the enclosures.804. In some examples, the plurality of electronic devices 806 includes a first electronic device 806A, a second electronic device 806B, and a third electronic device 806C.

The first electronic device 806A includes a first electronic module 808, a second electronic module 810, a fourth electronic module 812, a first management module 816A, and a second management module 816B. The first electronic module 808 having a full-width and a 1 U height is mounted to a first tray 814A of a chassis 846A of the first electronic device 806A. The second electronic module 810 having a half-width and the 1 U height is mounted to a second tray 814B at a second position. In some examples, a third electronic module (not shown) having the half-width and a 2 U height may be mounted to the second tray 814B at a first position. Further, the fourth electronic module 812 having the half-width and the 1 U height is mounted to a mezzanine tray 814C. In some examples, the first and second management modules 816A, 816B are mounted to a fourth tray 814D at the first position and second position respectively.

The second electronic device 806B includes a first electronic module 818, a second electronic module 820, a third electronic module 822, a first management module 826A, and a third management module 826B. The first electronic module 818 having the full length and the 1 U height is mounted to a first tray 824A of a chassis 846B of the second electronic device 806B. The second electronic module 820 having the full-width and the 1 U height is mounted to a second tray 824B. Further, the third electronic module 822 having the full-width and the 1 U height is mounted to the third tray 824C. The first and second management modules 826A, 826B are mounted to a fourth tray 824D at the first position and second position respectively.

The third electronic device 806C includes a first electronic module 828, a second electronic module 830, a third electronic module 832, a first management module 836A, and a second management module 836B. The first electronic module 828 having a full-width and a 1 U height is mounted to a first tray 834A of a chassis 846C of the third electronic device 806C. The second electronic module 830 having a half-width and a 1 U height is mounted to a second tray 814B at a first position. Similarly, the third electronic module 832 having the half-width and the 1 U height is mounted to the second tray 814B at a second position. In some examples, a fourth electronic module (not shown) having the full-width and the 1 U height may be mounted to a third tray 834C. Further, the first and second management modules 836A, 836B are mounted to a fourth tray 814D at the first position and second position respectively.

FIG. 9 depicts a flowchart depicting a method 900 of determining assembling one or more electronic modules having different form factors to an electronic device. It may be noted herein that the method 900 is described in conjunction with FIGS. 3A-3D, 4A-4C, 5A-5C, and 6A-6C, for example. The method 900 starts at block 902 and continues to block 904.

At block 904, the method 900 includes engaging some of a plurality of first engagement members of a first tray among a plurality of trays of a chassis with first complementary engagement members of a first electronic module having a first width, as the first electronic module is mounted to the first tray. In some examples, each of the plurality of first engagement members is a groove and each of the first complementary engagement members is a protrusion. In some other examples, each of the plurality of first engagement members may be the protrusion and each of the first complementary engagement members may be the groove. The method 900 continues to block 906.

At block 906, the method 900 includes engaging a first pair of engagement members or a second pair of engagement members of a plurality of second engagement members of a second tray among the plurality of trays with second complementary engagement members of a second electronic module having a second width, as the second electronic module is mounted to the second tray. In some examples, the first width is different from the second width. In particular, the first width is greater than the first width. For example, the first width is a full-width and the second width is a half-width. Further, the first tray and the second tray are vertically spaced apart from each other by a height, which is one of a 1 unit (1 U) height or a 2 U height. In some examples, each of the first engagement members and the second engagement members includes the first pair of engagement members and the second pair of engagement members. Further, the engagement members in each pair of the first pair of engagement members and the second pair of engagement members are spaced apart from each other by a first distance. In some examples, the first pair of engagement members and the second pair of engagement members are spaced apart from each other by a second distance different from the first distance. In particular, the second distance is greater than the first distance.

In some examples, the first pair of engagement members is configured to engage with the complementary engagement members of the second electronic module in a state of the second electronic module mounted to the tray in a first position. Further, the second pair of engagement members is configured to engage with the complementary engagement members of the second electronic module in the state of the second electronic module mounted to the tray in a second position. However, the plurality of engagement members is configured to prevent mounting of the second electronic module to the tray in an intermediate position between the first position and the second position. In other words, the plurality of engagement members is configured to prevent mounting of the second electronic module to the tray in any position other than the first position and the second position. The method 900 ends at block 908.

Since a tray provides the options of accommodating different form factor electronic modules in a chassis, it provides flexibility to upgrade existing electronic modules of varying form factors without changing the chassis. As the chassis can be reconfigured to support electronic modules of varying form factors, next generation electronic modules may be designed to any of the known form factor to easily fit into existing chassis. Hence, cost incurred from redesigning of the chassis, based on the varying form factors of the electronic modules may be avoided. Further, the chassis designed may extend to the lifecycle of a single chassis, providing substantial cost saving for the next generation of electronic modules. Additionally, the chassis may provide support to an extensive range of electronic modules, from low power/speeds to very high power/speeds, typically seen in 2 U products. Thus, the chassis configured to provide support to electronic modules of different form factors, the chassis may also be able to support a wide range of speeds, ports and power to an electronic device.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A chassis of an electronic device, comprising:

a frame defining an enclosure; and a tray removably coupled to the frame and comprising a plurality of engagement members configured to engage with complementary engagement members of one or more electronic modules as the one or more electronic modules are mounted to the tray, the plurality of engagement members comprising a first pair of engagement members and a second pair of engagement members disposed adjacent to each other on a base of the tray, where engagement members in each pair of the first pair of engagement members and the second pair of engagement members are spaced apart from each other by a first distance, a mezzanine tray comprising:

a third pair of engagement members spaced apart from each other by the first distance;

a first end configured to be removably coupled to the tray via a support beam extending perpendicularly from the first end; and a second end configured to be removably coupled to the frame such that a bay defined within the enclosure is bifurcated into a first sub-bay having a first height and multiple second sub-bays positioned adjacent to the first sub-bay, each second sub-bay having a respective, different height that is smaller than the first height, wherein the first pair of engagement members and the second pair of engagement members are spaced apart from each other by a second distance different from the first distance, wherein, in a state of the mezzanine tray not coupled to the tray and the frame, the plurality of engagement members is configured to allow for mounting of a first electronic module to the tray, wherein, in the state of the mezzanine tray coupled to the tray and the frame:

the plurality of engagement members and the third pair of engagement members are configured to allow for mounting of a second electronic module to any one of the first sub-bay or the multiple second sub-bays, and the plurality of engagement members and the mezzanine tray are configured to prevent mounting of a third electronic module having the first height in the multiple second sub-bays and to allow for mounting of the third electronic module in the first sub-bay, and wherein each of the tray and the first electronic module has a first width and the second electronic module and the mezzanine tray has a second width different from the first width.

2. The chassis of claim 1, wherein:

the first pair of engagement members is configured to engage with complementary engagement members of the second electronic module in a state of the second electronic module mounted to the tray in a first position; and the second pair of engagement members is configured to engage with the complementary engagement members of the second electronic module in a state of the second electronic module mounted to the tray in a second position.

3. The chassis of claim 2, wherein the plurality of engagement members is configured to prevent mounting of the second electronic module to the tray in an intermediate position between the first position and the second position.

4. The chassis of claim 2, wherein the plurality of engagement members is configured to prevent mounting of the second electronic module to the tray in any position other than the first position and the second position.

5. The chassis of claim 2, wherein at least some of the plurality of engagement members are configured to engage with the complementary engagement members of the first electronic module in the state of the first electronic module mounted to the tray.

6. The chassis of claim 2, wherein at least one engagement member of the first pair and at least one engagement of the second pair are configured to engage with complementary engagement members of the first electronic module in the state of the first electronic module mounted to the tray.

7. The chassis of claim 2, wherein each of the plurality of engagement members is configured to engage with complementary engagement members of the first electronic module in the state of the first electronic module mounted to the tray.

8. The chassis of claim 1, wherein the tray further comprises a plurality of through-openings formed on the base, and wherein, in a state of the one or more electronic modules being mounted on the base of the tray, a prong formed on each latch of a plurality of latches in the one or more electronic modules engages with a corresponding through-opening of the plurality of through-openings to retain the one or more electronic modules in the tray.

9. The chassis of claim 8, wherein the tray further comprises a plurality of first holes formed on a rim portion of the tray, and wherein, in the state of the one or more electronic modules being mounted to the tray, a second hole formed on each latch of the plurality of latches is aligned with a corresponding first hole of the plurality of first holes to receive a fastener of a plurality of fasteners and lock the one or more electronic modules to the tray.

10. The chassis of claim 1, wherein the tray further comprises a pair of mounting flanges, where each mounting flange has a first bore and extends sidewise from a corresponding end of a rim portion of the tray, and wherein, in a state of the tray being removably disposed between a pair of side structures of the frame, the first bore in each mounting flange is aligned to a second bore formed in a corresponding side structure of the pair of side structures to receive a fastener of a pair of fasteners and removably couple the tray to the frame.

11. The chassis of claim 1, wherein each engagement member of the plurality of engagement members extends length wise from a front portion towards a rear portion of the tray.

12. The chassis of claim 1, wherein each of the plurality of engagement members comprises one of a groove or a protrusion, and wherein each of the complementary engagement members comprises other one of the groove or the protrusion.

13. An electronic device, comprising:
a chassis comprising:
  a frame defining an enclosure having a pair of side structures; and
  a plurality of trays comprising a mezzanine tray, a first tray, and a second tray, the first tray and the second tray are vertically spaced apart from each other by a height, each of the first tray and the second tray is removably coupled to the pair of side structures,
  wherein each tray of the first tray and the second tray comprises: a plurality of engagement members comprising a first pair of engagement members and a second pair of engagement members disposed adjacent to each other on a base of each tray, where engagement members in each pair of the first pair of engagement members and the second pair of engagement members are spaced apart from each other by a first distance, and wherein the first pair of engagement members and the second pair of engagement members are spaced apart from each other by a second distance different from the first distance, and
  wherein the mezzanine tray is disposed between the first tray and the second tray, and comprises:
    a third pair of engagement members spaced apart from each other by the first distance;
    a first end configured to be removably coupled to one of the first tray or the second tray via a support beam extending perpendicularly from the first end; and
    a second end configured to be removably coupled to one of the pair of side structures such that a bay defined within the enclosure is bifurcated into a first sub-bay having a first height and multiple second sub-bays positioned adjacent to the first sub-bay, each second sub-bay having a respective, different height that is smaller than the first height;
  a first electronic module having the first height and configured to be, in a state of the mezzanine tray coupled to the one of the first tray or the second tray and to the one of the pair of side structures, mounted to the first tray within the first sub-bay and prevented from being mounted in the multiple second sub-bays, wherein the first electronic module comprises first complementary engagement members configured to be engaged with at least some of the plurality of engagement members of the first tray to mount the first electronic module to the first tray; and
  a second electronic module configured to be, in a state of the mezzanine tray coupled to the one of the first tray or the second tray and to the one of the pair of side structures, mounted to any one of the first sub-bay, the multiple second sub-bays, or the second tray, wherein the second electronic module comprises second complementary engagement members configured to be engaged with the first pair of engagement members of the second tray to mount the second electronic module to the second tray,
wherein each of the first tray and the second tray has a first width and the second electronic module and the mezzanine tray has a second width different from the first width.

14. The electronic device of claim 13, comprising:
a third electronic module mounted to the second tray in a second position, wherein the third electronic module comprises third complementary engagement members engaged with the second pair of engagement members of the second tray to mount the third electronic module to the second tray.

15. The electronic device of claim 14, wherein the plurality of engagement members is configured to prevent mounting of the second electronic module or the third electronic module to the second tray in an intermediate position between the first position and the second position.

16. The electronic device of claim 13, wherein each side structure of the pair of side structures comprises a plurality of guide members, where each guide member is disposed along a length of the chassis, and wherein a pair of guide members of the plurality of guide members, disposed on the pair of side structures directs a tray of the plurality of trays to slide into the frame and removably couple to the frame.

17. The electronic device of claim 13, wherein the first tray further comprises a plurality of first through-openings formed on the base of the first tray, and the second tray further comprises a plurality of second through-openings formed on the base of the second tray, wherein the first electronic module comprises a plurality of first latches, each first latch having a first prong, and the second electronic module comprises a plurality of second latches, each second latch having a second prong, and wherein each first prong engages with a corresponding first through-opening of the plurality of first through-openings to retain the first electronic module to the first tray, and each second prong engages with a corresponding second through-opening of the plurality of second through-openings to retain the second electronic module to the second tray.

18. The electronic device of claim 13, wherein the first tray further comprises a plurality of first electro-magnetic gaskets disposed on the base of the first tray, wherein the first electronic module further comprises a second electro-magnetic gasket disposed on a cover portion of the first electronic module, wherein, when the first electronic module is mounted to the first tray, the plurality of first electro-magnetic gaskets contacts a bottom portion of the first electronic module and the second electro-magnetic gasket contacts an auxiliary base portion of the second tray, to discharge electrostatic energy stored in the first electronic module to the first tray and the second tray respectively, and prevent an electromagnetic interference (EMI) noise from radiating through the first electronic module.

19. A method of assembling one or more electronic modules having different form factors to an electronic device, comprising:
engaging some of a plurality of first engagement members of a first tray among a plurality of trays of a chassis with first complementary engagement members of a first electronic module having a first width, as the first electronic module is mounted to the first tray;
engaging a first pair of engagement members of a plurality of second engagement members of a second tray among the plurality of trays with second complementary engagement members of a second electronic module having a first height and a second width, as the second electronic module is mounted to the second tray in a first sub-bay, where the first width is different from the second width, wherein the first tray and the second tray are vertically spaced apart from each other by a height; and engaging a third pair of engagement members of a mezzanine tray or a second pair of engagement members of the plurality of second engagement members with third complementary engagement members of a third electronic module having the second width, to mount the third electronic module in one of multiple second sub-bays, wherein the mezzanine tray is disposed between the first tray and the second tray, and comprises the third pair of engagement members, a first end configured to be removably coupled to one of the first tray or the second tray via a support beam extending perpendicularly from the first end, and a second end configured to be removably coupled to a frame of the chassis such that a bay defined within the enclosure is bifurcated into the first sub-bay having the first height and the multiple second sub-bays positioned adjacent to the first sub-bay, each second sub-bay having a respective, different height that is smaller than the first height, wherein each of the first engagement members and the second engagement members comprises the first pair of engagement members and the second pair of engagement members, wherein engagement members in each pair of the first pair of engagement members and the second pair of engagement members are spaced apart from each other by a first distance, and wherein the first pair of engagement members and the second pair of engagement members are spaced apart from each other by a second distance different from the first distance.

* * * * *